US008884650B2

(12) United States Patent
Miyazaki

(10) Patent No.: US 8,884,650 B2
(45) Date of Patent: Nov. 11, 2014

(54) HIGH-FREQUENCY SEMICONDUCTOR SWITCHING CIRCUIT

(71) Applicant: Panasonic Corporation, Osaka (JP)

(72) Inventor: Takahito Miyazaki, Kyoto (JP)

(73) Assignee: Panasonic Corporation, Osaka (JP)

( * ) Notice: Subject to any disclaimer, the term of this patent is extended or adjusted under 35 U.S.C. 154(b) by 73 days.

(21) Appl. No.: 13/741,999

(22) Filed: Jan. 15, 2013

(65) Prior Publication Data

US 2013/0127495 A1    May 23, 2013

Related U.S. Application Data

(63) Continuation of application No. PCT/JP2011/001245, filed on Mar. 3, 2011.

(30) Foreign Application Priority Data

Nov. 25, 2010    (JP) .................................. 2010-262705

(51) Int. Cl.

| H01L 25/00 | (2006.01) |
|---|---|
| H03K 19/173 | (2006.01) |
| H03K 19/177 | (2006.01) |
| G06F 7/38 | (2006.01) |
| H01L 21/70 | (2006.01) |
| H03K 17/567 | (2006.01) |
| H03K 17/76 | (2006.01) |
| H03K 19/00 | (2006.01) |

(52) U.S. Cl.
CPC .......... *H03K 19/0013* (2013.01); *H03K 17/567* (2013.01); *H03K 17/76* (2013.01)
USPC ............... 326/47; 326/41; 327/564; 327/374; 257/499

(58) Field of Classification Search
CPC ................. H03K 19/17736; H03K 19/17728; H03K 19/17704; H03K 19/17796; H03K 19/01721; H03K 19/01707; H01L 23/525; H01L 23/50; H01L 27/0207; H01L 2924/3011; H01L 2924/14; H01L 2924/19041; G06F 1/10
USPC .......... 326/37–41, 47, 101, 17; 327/564, 415, 327/374; 716/100–139
See application file for complete search history.

(56) References Cited

U.S. PATENT DOCUMENTS

| 7,173,471 B2* | 2/2007 | Nakatsuka et al. ........... 327/308 |
| 7,337,547 B2* | 3/2008 | Yasuda et al. ................. 333/103 |

(Continued)

FOREIGN PATENT DOCUMENTS

| JP | 6-085641 A | 3/1994 |
| JP | 8-250648 A | 9/1996 |

(Continued)

OTHER PUBLICATIONS

International Search Report issued in International Patent Application No. PCT/JP2011/001245 mailed Apr. 19, 2011.

*Primary Examiner* — Dylan White
(74) *Attorney, Agent, or Firm* — McDermott Will & Emery LLP

(57) ABSTRACT

A diode-switch logic circuit of the present invention is configured such that: at least one of paths between a common input-output terminal and respective individual input-output terminals is caused to become a conducting state; control voltages of control terminals are respectively applied to gates of path switching FET stages; logic synthesis voltages of the control voltages of the control terminals are respectively applied to gates of shunt FET stages; and each of the logic synthesis voltages is generated by a logical product of a logical negation of the control voltage applied to one shunt FET stage and a logical sum of the control voltages respectively applied to the remaining shunt FET stages.

10 Claims, 19 Drawing Sheets

(56) References Cited

U.S. PATENT DOCUMENTS

| | | | |
|---|---|---|---|
| 7,589,602 B2* | 9/2009 | Poveda et al. | 333/103 |
| 7,636,004 B2* | 12/2009 | Nakatsuka et al. | 327/308 |
| 2005/0017789 A1* | 1/2005 | Burgener et al. | 327/436 |
| 2006/0001473 A1* | 1/2006 | Yasuda et al. | 327/415 |

FOREIGN PATENT DOCUMENTS

| | | |
|---|---|---|
| JP | 2001-068984 A | 3/2001 |
| JP | 2006-050583 A | 2/2006 |
| JP | 4105183 B2 | 6/2008 |

\* cited by examiner

| ON OR OFF OF PATHS ||| CONTROL VOLTAGE ||| OUTPUT OF DIODE SWITCH LOGIC CIRCUIT |||
|---|---|---|---|---|---|---|---|---|
| 101-102 | 101-103 | 101-104 | 105 | 106 | 107 | $\overline{105}$ AND (106 OR 107) | $\overline{106}$ AND (105 OR 107) | $\overline{107}$ AND (105 OR 106) |
| ON | OFF | OFF | High | Low | Low | Low | High | High |
| OFF | ON | OFF | Low | High | Low | High | Low | High |
| OFF | OFF | ON | Low | Low | High | High | High | Low |
| ON | ON | OFF | High | High | Low | Low | Low | High |
| ON | OFF | ON | High | Low | High | Low | High | Low |
| OFF | ON | ON | Low | High | High | High | Low | Low |
| ON | ON | ON | High | High | High | Low | Low | Low |

Fig. 2

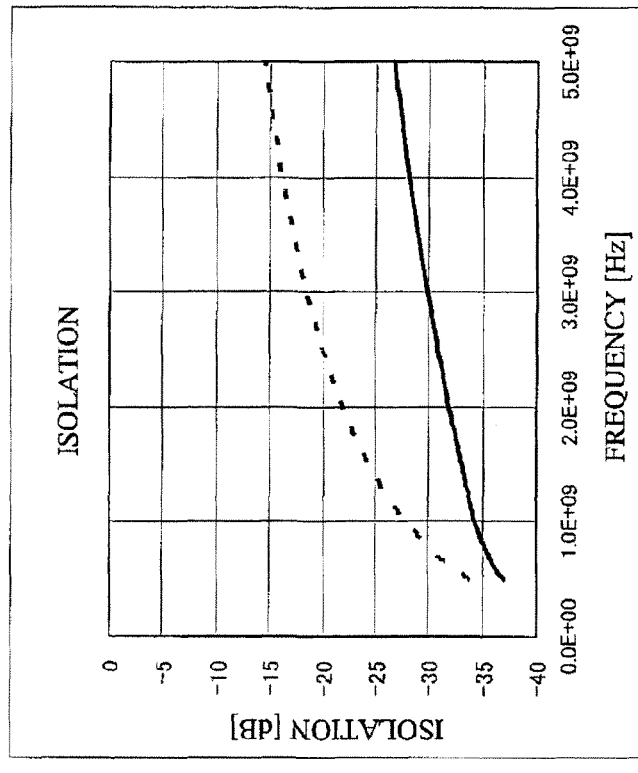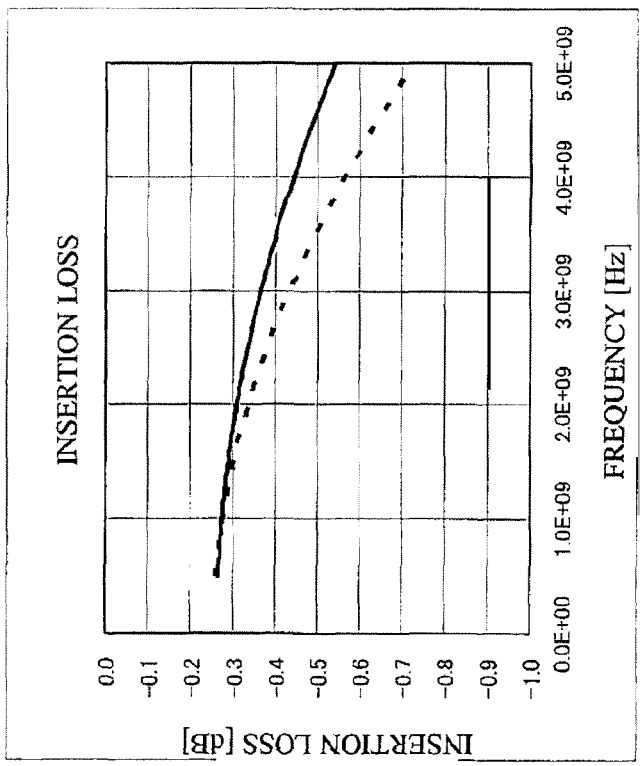
Fig. 4

| ON OR OFF OF PATHS | | | CONTROL VOLTAGE | | | | | |
|---|---|---|---|---|---|---|---|---|
| 1201-1202 | 1201-1203 | 1201-1204 | 1205 | 1206 | 1207 | 1208 | 1209 | 1210 |
| ON | OFF | OFF | High | Low | Low | Low | High | High |
| OFF | ON | OFF | Low | High | Low | High | Low | High |
| OFF | OFF | ON | Low | Low | High | High | High | Low |
| ON | ON | OFF | High | High | Low | Low | High | High |
| ON | OFF | ON | High | Low | High | High | Low | Low |
| OFF | ON | ON | Low | High | High | Low | Low | Low |
| ON | ON | ON | High | High | High | Low | Low | Low |

Fig. 16
[PRIOR ART]

HIGH-FREQUENCY SEMICONDUCTOR SWITCHING CIRCUIT

This is a continuation application under 35 U.S.C. 111(a) of pending prior International application No. PCT/JP2011/001245, filed on Mar. 3, 2011. The disclosure of Japanese Patent Application No. 2010-262705 filed on Nov. 25, 2010 including specification, drawings and claims are incorporated herein by reference in its entirety.

BACKGROUND OF THE INVENTION

1. Field of the Invention

The present invention relates to a high-frequency semiconductor switching circuit.

2. Description of the Related Art

Trend of High-Frequency Semiconductor Switching Circuit

In mobile communication devices as represented by mobile phones, high-frequency semiconductor switching circuits which are small in size and low in power consumption are required to switch high-frequency signal transmission paths, such as to switch the transmission and reception with respect to an antenna. A high-frequency semiconductor switching circuit including as a switching element a GaAs-FET (Gallium Arsenide Field Effect Transistor) which excels in a high frequency property and low power consumption has been used.

In recent years, a semiconductor substrate, as represented by a SOS (Silicon On Sapphire) substrate or a SOI (Silicon On Insulator) substrate, produced by the combination of a substrate material having an excellent insulation property and a silicon process has been improved. In addition, a technology of adopting a MOSFET (Metal Oxide Semiconductor Field Effect Transistor) as a switching element for path switching has been developed although the MOSFET has been unfavorable for use in the high-frequency semiconductor switching circuit. For example, the MOSFET can be caused to become a conducting state by applying a high-level voltage (for example, 3 V), adequately higher than a pinch-off voltage, as a gate bias voltage to create a low impedance between a drain and a source. In contrast, the MOSFET can be caused to become a cutoff state by applying a low-level voltage (for example, 0 V), adequately lower than the pinch-off voltage, as the gate bias voltage to create a high impedance between the drain and the source.

Conventional Configuration Example 1

FIG. 14 is a circuit diagram showing Configuration Example 1 of a conventional high-frequency semiconductor switching circuit as shown in FIG. 13 of Japanese Patent No. 4105183. The high-frequency semiconductor switching circuit of FIG. 14 is, for example, a high-frequency SP3T (Single-Pole Triple-Throw) switch used as, for example, an antenna switch configured to switch output paths for an input high-frequency signal. The high-frequency semiconductor switching circuit of FIG. 14 includes a common input-output terminal 1101 and individual input-output terminals 1102, 1103, and 1104. A path switching FET stage 1108 configured to perform switching of high-frequency signal paths is connected between the common input-output terminal 1101 and the individual input-output terminal 1102. Moreover, a path switching FET stage 1109 configured to perform the switching of the high-frequency signal paths is connected between the common input-output terminal 1101 and the individual input-output terminal 1103. Further, a path switching FET stage 1110 configured to perform the switching of the high-frequency signal paths is connected between the common input-output terminal 1101 and the individual input-output terminal 1104.

Each of the path switching FET stages 1108, 1109, and 1110 is constituted by MESFETs (Metal-Semiconductor Field Effect Transistors) of a GaAs material and has a structure in which a metal of a schottky junction type is formed as a gate on a semiconductor substrate. Gates of the MESFETs constituting the path switching FET stage 1108 are connected to a control terminal 1105 through a gate bias resistor 1111. Moreover, gates of the MESFETs constituting the path switching FET stage 1109 are connected to a control terminal 1106 through a gate bias resistor 1112. Further, gates of the MESFETs constituting the path switching FET stage 1110 are connected to a control terminal 1107 through a gate bias resistor 1113.

By respectively applying control voltages to the control terminals 1105, 1106, and 1107, the path switching FET stages 1108, 1109, and 1110 are caused to become the conducting state or the cutoff state. With this, the common input-output terminal 1101 is electrically connected to at least one of the individual input-output terminals 1102, 1103, and 1104.

However, in a case where a high-frequency semiconductor switching circuit is constituted only by path switching FETs, such as the MESFETs of Conventional Configuration Example 1, there is a problem of achieving both low insertion loss and high isolation. To be specific, in each path switching FET, a gate width may be reduced in order to obtain the high isolation. However, there is a problem that since an on resistance increases by reducing the gate width, the insertion loss deteriorates.

Conventional Configuration Example 2

FIG. 15 is a circuit diagram showing Configuration Example 2 of the conventional high-frequency semiconductor switching circuit as shown in FIG. 14 of Japanese Patent No. 4105183. The high-frequency semiconductor switching circuit of FIG. 15 is a high-frequency SP3T switch configured such that path switching FET stages and shunt FET stages for securing the isolation are combined on high-frequency signal paths. By combining the path switching FET stages and the shunt FET stages as above, the high-frequency signal leaking through capacitor components of the path switching FETs of the cutoff state can be caused to be sent to ground by the shunt FETs of the conducting state. Thus, the high isolation can be obtained. To be specific, the problem of Conventional Configuration Example 1 is solved.

More specifically, a shunt FET stage 1214 is provided between an individual input-output terminal 1202 and the ground. With this, when a state between a common input-output terminal 1201 and the individual input-output terminal 1202 is the cutoff state, the signal leaking from the common input-output terminal 1201 through a path switching FET stage 1211 to the individual input-output terminal 1202 is sent to the ground. Similarly, a shunt FET stage 1215 is provided between an individual input-output terminal 1203 and the ground. Further, a shunt FET stage 1216 is provided between an individual input-output terminal 1204 and the ground.

As above, in the high-frequency semiconductor switching circuit of FIG. 15, a shunt circuit is constituted by the shunt FET stages 1214, 1215, and 1216. Resistor groups 1220, 1221, and 1222 denote resistors respectively connected to the gates of the FETs of the shunt FET stages 1214, 1215, and 1216. DC cut capacitors 1223, 1224, and 1225 denote DC cut capacitors respectively connected to the shunt FET stages 1214, 1215, and 1216 in series.

By respectively applying control voltages to control terminals 1205 to 1210, three path switching FET stages 1211 to 1213 and three shunt PET stages 1214 to 1216 are caused to become the conducting state or the cutoff state. Specifically, as shown by a truth table of FIG. 16, when the control terminal 1205 becomes the high level, the control terminal 1208 becomes the low level. Similarly, when the control terminal 1206 becomes the high level, the control terminal 1209 becomes the low level. Further, when the control terminal 1208 becomes the high level, the control terminal 1210 becomes the low level. With this, the isolation property between the high-frequency signals is satisfactorily maintained. Two or more out of the control terminals 1205 to 1207 may become the high level at the same time.

However, in order to adopt the configuration in which the path switching FET stages and the shunt FET stages are combined as in Conventional Configuration Example 2, three control terminals are required to individually control the control voltages applied to the gates of the shunt FET stages. Therefore, six control terminals including three control terminals for controlling the control voltages applied to the gates of the path switching FET stages are required. As a result, the number of pins of an IC package of the high-frequency semiconductor switching circuit increases, and the size of the IC package of the high-frequency semiconductor switching circuit increases. Therefore, this high-frequency semiconductor switching circuit is inappropriate for mobile communication devices which are required to be reduced in size.

Conventional Configuration Example 3

FIG. 17 is a circuit diagram showing Configuration Example 3 of the conventional high-frequency semiconductor switching circuit as shown in FIG. 3 of Japanese Laid-Open Patent Application Publication No. 6-85641. As shown in FIG. 17, one example of the easiest method of avoiding the increase in the number of control terminals is a method of respectively inserting inverter circuits 1326 to 1328 in control terminals 1305 to 1307. As shown in FIG. 18, the inverter circuit is a circuit configured to invert an input voltage to generate an output voltage. When a high-level input voltage is applied to the inverter circuit, the inverter circuit generates a low-level output voltage. When a low-level input voltage is applied to the inverter circuit, the inverter circuit generates a high-level output voltage. Specifically, an input port of the inverter circuit 1326 is connected to the control terminal 1305, and an output port thereof is connected through a resistor group 1320 to respective gates of a shunt FET stage 1314. Moreover, an input port of the inverter circuit 1327 is connected to the control terminal 1306, and an output port thereof is connected through a resistor group 1321 to respective gates of a shunt FET stage 1315. Further, an input port of the inverter circuit 1328 is connected to the control terminal 1307, and an output port thereof is connected through a resistor group 1322 to respective gates of a shunt FET stage 1316. Power supply ports of the inverter circuits 1326 to 1328 are connected to a power supply terminal 1308.

According to the configuration shown in FIG. 17, the same operations as the high-frequency semiconductor switching circuit shown in FIG. 15 are performed only by the control terminals 1305, 1306, and 1307. Specifically, when a path switching FET stage 1311 becomes the conducting state, the shunt FET stage 1314 becomes the cutoff state. Similarly, when a path switching FET stage 1312 becomes the conducting state, the shunt FET stage 1315 becomes the cutoff state. Further, when a path switching FET stage 1313 becomes the conducting state, the shunt FET stage 1316 becomes the cutoff state. With this, the isolation property between the high-frequency signals is satisfactorily maintained. Two or more out of the path switching FET stages 1311, 1312, and 1313 may become the conducting state at the same time.

However, in order to adopt the configuration including the inverter circuits as in Conventional Configuration Example 3, one or more power supply terminals are required for respective inverter circuits. As a result, there are problems that the number of pins of the IC package of the high-frequency semiconductor switching circuit increases, and the size of the IC package of the high-frequency semiconductor switching circuit increases. In addition, since there is a system not having a power supply voltage applying function, the use of Conventional Configuration Example 3 may be limited.

Conventional Configuration Example 4

FIG. 19 is a circuit diagram showing Configuration Example 4 of the conventional high-frequency semiconductor switching circuit as shown in FIG. 1 of Japanese Patent No. 4105183. As shown in FIG. 19, one example of the easiest method of avoiding the increase in the number of control terminals and the addition of the power supply terminal as in Conventional Configuration Example 3 is a method of inserting a diode logic circuit to each of control terminals 1405 to 1407. The diode logic circuit is constituted by a plurality of diodes formed as metal-semiconductor schottky junctions on a compound semiconductor substrate.

Specifically, diodes 1426 to 1431 are diodes constituting a diode logic circuit OR1 and are produced as the metal-semiconductor schottky junctions by using the same material as a gate electrode of a metal-semiconductor FET. This diode can be produced in a FET production process at the same time as the FET.

An anode of the diode 1426 is connected to the control terminal 1407, and a cathode thereof is connected to respective gates of a shunt FET stage 1414 and also connected through a resistor 1432 to ground. An anode of the diode 1427 is connected to the control terminal 1406, and a cathode thereof is connected to the cathode of the diode 1426.

An anode of the diode 1428 is connected to the control terminal 1407, and a cathode thereof is connected to respective gates of a shunt FET stage 1415 and also connected through a resistor 1433 to the ground. An anode of the diode 1429 is connected to the control terminal 1405, and a cathode thereof is connected to the cathode of the diode 1428.

An anode of the diode 1430 is connected to the control terminal 1406, and a cathode thereof is connected to respective gates of a shunt FET stage 1416 and also connected through a resistor 1434 to the ground. An anode of the diode 1431 is connected to the control terminal 1405, and a cathode thereof is connected to the cathode of the diode 1430.

According to the configuration of FIG. 19, the same operations as the high-frequency semiconductor switching circuits shown in FIGS. 15 and 17 are performed only by three control terminals 1405 to 1407 without providing a common power supply terminal. Specifically, when a path switching FET stage 1411 becomes the conducting state, the shunt FET stage 1414 becomes the cutoff state. Similarly, when a path switching FET stage 1412 becomes the conducting state, the shunt FET stage 1415 becomes the cutoff state. When a path switching FET stage 1413 becomes the conducting state, the shunt FET stage 1416 becomes the cutoff state. With this, the isolation property between the high-frequency signals is satisfactorily maintained.

SUMMARY OF THE INVENTION

However, even if Conventional Configuration Example 4 shown in FIG. 19 is adopted, the following problem occurs. To be specific, two or more out of the path switching FET stages 1411 to 1413 cannot be caused to become the conducting state at the same time.

For example, when the control terminals 1405 and 1406 become the high level at the same time, and the control terminal 1407 becomes the low level, the path switching FET stage 1411 and the shunt FET stage 1414 become the conducting state at the same time. Therefore, the deterioration of the insertion loss occurs, and the path switching FET stage 1411 does not normally become the conducting state as a switch.

Since the path switching FET stage 1412 and the shunt FET stage 1415 become the conducting state at the same time, the deterioration of the insertion loss occurs, and the path switching FET stage 1412 does not normally become the conducting state as a switch.

Since the path switching FET stage 1413 becomes the cutoff state, and the shunt FET stage 1416 becomes the conducting state, only the path switching PET stage 1413 normally becomes the cutoff state as a switch.

The present invention was made to solve the above problems, and an object of the present invention is to provide a high-function high-frequency switching circuit capable of causing two or more path switching FET stages to become the conducting state at the same time while maintaining satisfactory properties, such as low insertion loss, high isolation, and low strain and realizing size reduction and low power consumption without adding a power supply terminal.

To solve the above problems, a high-frequency semiconductor switching circuit according to one aspect of the present invention includes: a semiconductor substrate; one common input-output terminal, three or more individual input-output terminals, and three or more control terminals corresponding to the three or more individual input-output terminals, these terminals being formed on the semiconductor substrate; three or more path switching FET stages formed on the semiconductor substrate and each provided between the common input-output terminal and a corresponding one of the three or more individual input-output terminals; one or more shunt FET stages formed on the semiconductor substrate and each provided between ground and at least one of the three or more individual input-output terminals; and a diode-switch logic circuit including diodes and switches formed on the semiconductor substrate such that a group of a part of the diodes and a part of the switches corresponds to each of the one or more shunt FET stages, the diode-switch logic circuit being configured to control the three or more path switching FET stages and the one or more shunt FET stages, wherein: the diode-switch logic circuit is configured to respectively apply control voltages, respectively input to the three or more control terminals, to gates of the three or more path switching FET stages in order that at least one of high-frequency signal paths between the common input-output terminal and the respective individual input-output terminals is caused to become a conducting state, and the other high-frequency signal paths are caused to become a cutoff state; the diode-switch logic circuit is configured to respectively apply logic synthesis voltages to gates of the one or more shunt FET stages, each of the logic synthesis voltages being obtained by logic synthesis of the control voltages respectively input to the three or more control terminals; and the diode-switch logic circuit is configured such that in a case where the one or more shunt FET stages are three or more shunt FET stages corresponding to the three or more path switching FET stages, the logic synthesis voltage corresponding to one of the three or more shunt FET stages is generated as a logical product of a logical negation of the control voltage applied to the one of the three or more shunt FET stages and a logical sum of the control voltages respectively applied to the remaining shunt FET stages other than the one of the three or more shunt FET stages.

In the above high-frequency semiconductor switching circuit, in a case where the one or more shunt FET stages are the three or more shunt FET stages corresponding to the three or more path switching FET stages, the diodes and the switches corresponding to the one of the three or more shunt FET stages may be respectively connected in series to the remaining control terminals other than the control terminal to which the control voltage to be applied to the gate of one of the three or more path switching FET stages corresponding to the one of the three or more shunt FET stages is input, each of the switches may be an inversion control switch configured to be turned off when the control voltage to be applied to the gate is a high level and turned on when the control voltage to be applied to the gate is a low level, cathode sides of the diodes respectively connected to the remaining control terminals may be short-circuited, a ground resistor may be connected between ground and a short-circuit point where the cathode sides of the diodes respectively connected to the remaining control terminals are short-circuited, and a voltage of the short-circuit point may be the logic synthesis voltage to be applied to the gate of the one of the three or more shunt FET stages.

According to the above configuration, the diode-switch logic circuit performs the logic synthesis of three or more control voltages respectively input to three or more control terminals. With this, one or more shunt FET stages for securing the isolation can be controlled based on three or more control voltages respectively applied to the gates of three or more path switching FET stages. To be specific, since the gate voltage(s) of one or more shunt FET stages can be prepared by utilizing the control voltages respectively applied to the gates of three or more path switching FET stages, a power supply circuit including a power supply terminal and its wire are unnecessary. With this, while maintaining satisfactory properties, such as low insertion loss, high isolation, and low strain, the high-frequency semiconductor switching circuit can be reduced in size, and therefore, a mobile communication device including the high-frequency semiconductor switching circuit can be reduced in size, and the power consumption can be reduced. Further, unlike Conventional Configuration Example 4, two or more path switching FET stages can be caused to become the conducting state at the same time. Thus, the high-function high-frequency switching circuit can be realized.

The above high-frequency semiconductor switching circuit may further includes: first short circuit resistors each connected between a source and drain of a corresponding one of the three or more path switching FET stages; second short circuit resistors each connected between a source and drain of a corresponding one of the one or more shunt FET stages; first DC cut capacitors respectively provided at drain sides and source sides of the three or more path switching FET stages; and second DC cut capacitors respectively provided at drain sides and source sides of the one or more shunt FET stages, wherein: the short-circuit points at each of which the cathode sides of the diodes are short-circuited may be each connected through a corresponding one of the first short circuit resistors to the drain side of a corresponding one of the three or more path switching FET stages; and the three or more control terminals may be each connected through a corresponding one of the second short circuit resistors to the drain side of a corresponding one of the one or more shunt FET stages.

According to the above configuration, the present invention can provide the high-frequency semiconductor switching circuit having the above effects, capable of causing the path switching FET stages to surely become the conducting state or the cutoff state and suppressing the leakage to the high-frequency signal path of the cutoff state, and including satisfactory properties, such as high isolation and low strain. Further, without adding a dedicated power supply terminal, the source voltages and drain voltages of the path switching FET stages can be fixed. Therefore, the high-frequency semiconductor switching circuit can be reduced in size, and therefore, the mobile communication device including the high-frequency semiconductor switching circuit can be reduced in size, and the power consumption can be reduced.

In the above high-frequency semiconductor switching circuit, each of the three or more path switching FET stages may be configured by connecting a plurality of path switching FETs in series, each of the one or more shunt FET stages may be configured by connecting a plurality of shunt FETs in series, and a part of the path switching FETs constituting at least two out of the three or more path switching FET stages may be integrated.

According to the above configuration, for example, in a case where the type of electric power to be handled is different among the high-frequency signal paths, such as a case where the transmission and reception with respect to the mobile communication device are switched, a part of reception-side FET stages configured to handle low electric power can be integrated, and the integrated FET stage can be controlled by the diode-switch logic circuit. As a result, since it is unnecessary to increase the circuit configuration of a control system, a high-function high-frequency switching circuit capable of causing two or more path switching FET stages to become the conducting state at the same time can be realized while maintaining satisfactory properties, such as the low insertion loss, the high isolation, and the low strain, and realizing the size reduction and the low power consumption.

In the above high-frequency semiconductor switching circuit, the semiconductor substrate may be a SOI substrate or a SOS substrate.

According to the above configuration, the high-frequency semiconductor switching circuit can be provided by using the FETs formed on the SOS substrate or SOI substrate, which is high in specific resistance and does not require the application of the bias of the back gate. Moreover, the diodes can be formed on the SOS substrate or SOI substrate by utilizing a general MOSFET production process.

In the above high-frequency semiconductor switching circuit, the diodes may be PN junction diodes formed on the semiconductor substrate, anode sides of the diodes may be respectively connected to the control terminals, and cathode sides of the diodes may be respectively connected to the switches.

According to the above configuration, the PN junction diodes can be formed on the SOS substrate or SOI substrate by utilizing the general MOSFET production process.

In the above high-frequency semiconductor switching circuit, the diodes may be diode-connected NMOSFETs, drains of the diodes may be respectively connected to the control terminals, sources of the diodes may be respectively connected to the switches, and gates of the diodes may be respectively connected to the drains of the diodes.

According to the above configuration, the NMOSFET can operate in the same manner as a general diode by connecting (diode-connecting) the gate and drain thereof. In the case of a PN junction diode formed on a silicon substrate, the forward voltage of about 0.6 V is generated for each diode. In contrast, in the case of the diode-connected NMOSFET, the forward voltage can be controlled by adjusting the gate length, gate width, and pinch-off voltage of the NMOSFET. For example, in the NMOSFET in which the gate length is 0.25 μm, and the pinch-off voltage is 0.3 V, the forward voltage becomes 0.3 V to 0.6 V. Therefore, the voltage drop of the NMOSFET can be made smaller than that of the PN junction diode. As a result, the gate voltage applied to the gate electrode of each shunt FET stage can be set high, which is effective for the isolation property.

In the above high-frequency semiconductor switching circuit, the switches may be PMOSFETs, sources of the switches may be respectively connected to cathode sides of the diodes, drains of the switches may be respectively connected to the short circuit resistors, and gates of the switches may be respectively connected to the control terminals.

According to this configuration, for example, when the gate voltage is the high level, the gate voltage becomes adequately lower than the pinch-off voltage, and the PMOSFET becomes the cutoff state. When the gate voltage is the low level, the gate voltage becomes adequately higher than the pinch-off voltage, and the PMOSFET becomes the conducting state. Therefore, the calculation result of the logical negation (NOT) of the control voltage can be output. In the case of a PMOSFET formed on a normal silicon substrate which is low in specific resistance, a body potential needs to be connected to the highest potential, such as a power supply terminal, in a circuit to prevent latch-up. In contrast, in the case of a PMOSFET formed on a SOS substrate or SOI substrate which is high in specific resistance as it gets close to an insulator, elements are completely separated from one another, so that no problem occurs even if the body potential is floating. Therefore, the diode-switch logic circuit can be easily produced without providing an additional power supply terminal to prevent the latch-up.

In the above high-frequency semiconductor switching circuit, each of the three or more path switching FET stages may be configured by connecting a plurality of MOSFETs in series.

According to the above configuration, the withstand voltage in the case of handling the high-frequency signal of high electric power on the high-frequency signal path can be increased.

In the above high-frequency semiconductor switching circuit, each of the one or more shunt FET stages may be configured by connecting a plurality of MOSFETs in series.

According to the above configuration, the withstand voltage in the case of handling the high-frequency signal of high electric power on the high-frequency signal path can be increased.

According to the present invention, the high-function high-frequency switching circuit capable of causing two or more path switching FET stages to become the conducting state at the same time can be realized while maintaining satisfactory properties, such as low insertion loss, high isolation, and low strain and realizing the size reduction and the low power consumption without adding a power supply terminal.

The above object, other objects, features and advantages of the present invention will be made clear by the following detailed explanation of preferred embodiments with reference to the attached drawings.

BRIEF DESCRIPTION OF THE DRAWINGS

FIG. 2 is a control logic table of a diode-switch logic circuit of FIG. 1.

FIG. 4 shows graphs of comparisons of properties between Embodiment 1 of the present invention and Conventional Configuration Example 1 of FIG. 14.

FIG. 16 is a truth table of the high-frequency semiconductor switching circuit of FIG. 15.

DESCRIPTION OF THE PREFERRED EMBODIMENTS

Figure 1:
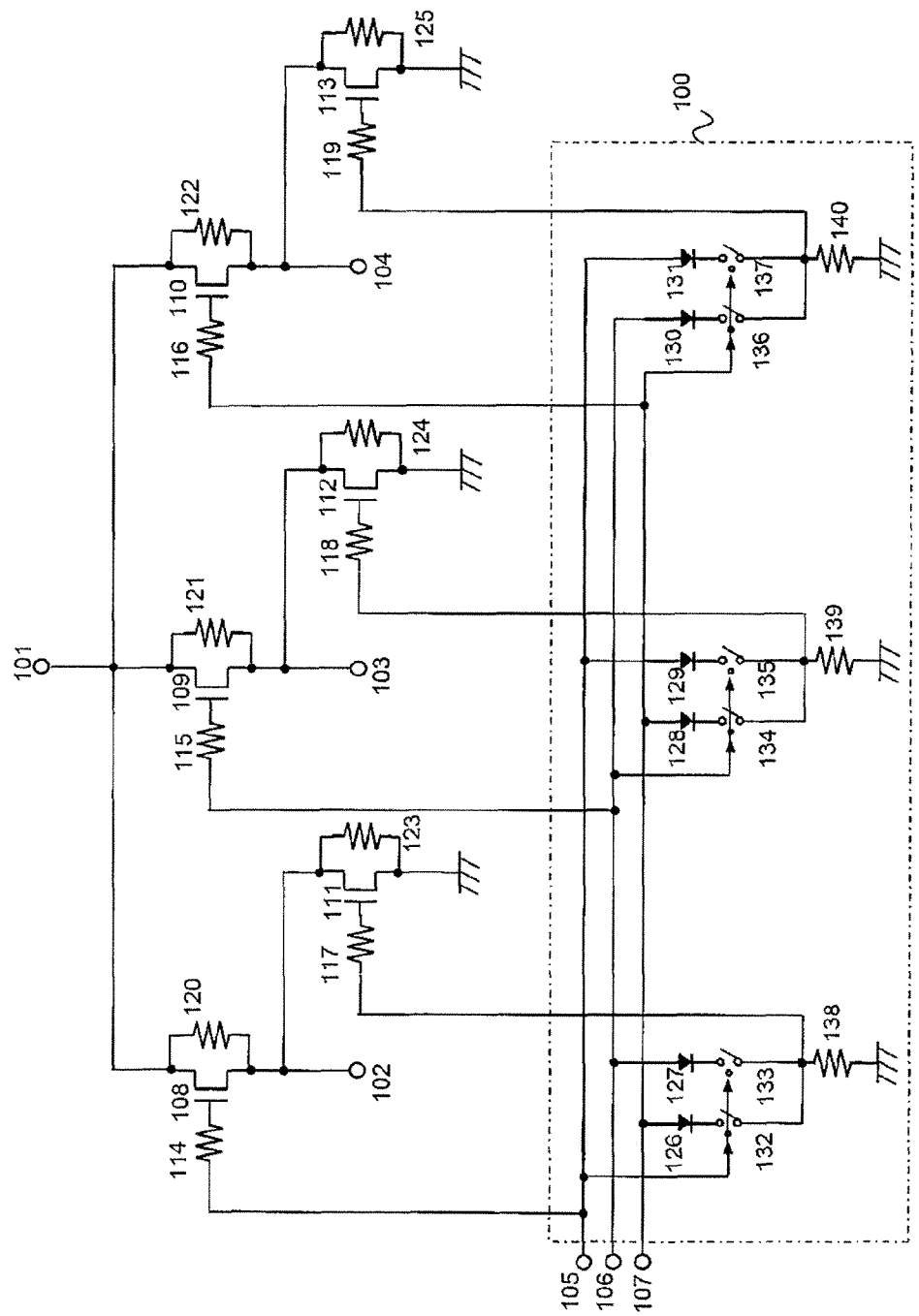
FIG. 1 is a circuit diagram showing a configuration example of a high-frequency semiconductor switching circuit according to Embodiment 1 of the present invention.

Hereinafter, preferred embodiments of the present invention will be explained in reference to the drawings. In the drawings, the same reference signs are used for the same or corresponding components, and a repetition of the same explanation is avoided.

Embodiment 1

Configuration of High-Frequency Semiconductor Switching Circuit

FIG. 1 is a circuit diagram showing a configuration example of a high-frequency semiconductor switching circuit according to Embodiment 1 of the present invention. The high-frequency semiconductor switching circuit of FIG. 1 is a high-frequency SP3T switch used as, for example, an antenna switch configured to switch output paths for an input high-frequency signal. The high-frequency semiconductor switching circuit of FIG. 1 includes a common input-output terminal 101 and individual input-output terminals 102, 103, and 104.

A path switching FET stage 108 is connected between the common input-output terminal 101 and the individual input-output terminal 102. A path switching FET stage 109 is connected between the common input-output terminal 101 and the individual input-output terminal 103. A path switching FET stage 110 is connected between the common input-output terminal 101 and the individual input-output terminal 104. Then, by turning on or off the path switching FET stages 108 to 110, the high-frequency semiconductor switching circuit can switch high-frequency signal paths extending from the common input-output terminal 101 to respective individual input-output terminals 102 to 104. Each of the path switching FET stages 108 to 110 is constituted by a MOSFET. A gate voltage necessary for an on-off operation can be applied from a control terminal 105 through a gate resistor 114 to a gate of the path switching FET stage 108. Moreover, the gate voltage necessary for the on-off operation can be applied from a control terminal 106 through a gate resistor 115 to a gate of the path switching FET stage 109. Further, the gate voltage necessary for the on-off operation can be applied from a control terminal 107 through a gate resistor 116 to a gate of the path switching FET stage 110.

A shunt FET stage 111 is connected between the individual input-output terminal 102 and ground. Moreover, a shunt FET stage 112 is connected between the individual input-output terminal 103 and the ground. Further, a shunt FET stage 113 is connected between the individual input-output terminal 104 and the ground. Each of the shunt FET stages 111 to 113 is configured to be turned on or off complementary to the corresponding path switching FET stage 108, 109, or 110. With this, the high isolation property is realized. Each of the shunt FET stages 111 to 113 is constituted by a MOSFET. The shunt FET stages 111 to 113 are turned on or off by controlling the gate voltages of the shunt FET stages 111 to 113.

A PN junction diode 126 and an inversion control switch 132 are connected to the control terminal 107, and a PN junction diode 127 and an inversion control switch 133 are connected to the control terminal 106. Output ports of the inversion control switches 132 and 133 are short-circuited, and its short-circuit point is connected through a gate resistor 117 to a gate of the shunt FET stage 111 and also connected through a ground resistor 138 to the ground. An anode side of the PN junction diode 126 is connected to the control terminal 107, and a cathode side thereof is connected to the inversion control switch 132. An anode side of the PN junction diode 127 is connected to the control terminal 106, and a cathode side thereof is connected to the inversion control switch 133.

Here, each of the inversion control switches 132 and 133 denotes a switch configured to perform an on-off operation in an inverted manner with respect to a logic level of the control voltage, that is, configured to be turned on when the control voltage is the low level and turned off when the control voltage is the high level. One example of each of the inversion control switches 132 and 133 is a below-described PMOS-FET. Each of the inversion control switches 132 and 133 is caused to become the conducting state or the cutoff state by the control voltage applied to the control terminal 105.

A PN junction diode 128 and an inversion control switch 134 are connected to the control terminal 107, and a PN junction diode 129 and an inversion control switch 135 are connected to the control terminal 105. Output ports of the inversion control switches 134 and 135 are short-circuited, and its short-circuit point is connected through a gate resistor 118 to a gate of the shunt FET stage 112 and also connected through a ground resistor 139 to the ground. An anode side of the PN junction diode 128 is connected to the control terminal 107, and a cathode side thereof is connected to the inversion control switch 134. An anode side of the PN junction diode 129 is connected to the control terminal 105, and a cathode side thereof is connected to the inversion control switch 135. Each of the inversion control switches 134 and 135 is caused to become the conducting state or the cutoff state by the control voltage applied to the control terminal 106.

A PN junction diode 130 and an inversion control switch 136 are connected to the control terminal 106, and a PN junction diode 131 and an inversion control switch 137 are connected to the control terminal 105. Ground-side output ports of the inversion control switches 136 and 137 are short-circuited, and its short-circuit point is connected through a gate resistor 119 to a gate of the shunt FET stage 113 and also connected through a ground resistor 140 to the ground. An anode side of the PN junction diode 130 is connected to the control terminal 106, and a cathode side thereof is connected to the inversion control switch 136. An anode side of the PN junction diode 131 is connected to the control terminal 105, and a cathode side thereof is connected to the inversion control switch 137. Each of the inversion control switches 136 and 137 is caused to become the conducting state or the cutoff state by the control voltage applied to the control terminal 107.

A short circuit resistor 120 is connected between a drain and source of the path switching FET stage 108. Moreover, a short circuit resistor 121 is connected between a drain and source of the path switching FET stage 109. Further, a short circuit resistor 122 is connected between a drain and source of the path switching FET stage 110. A short circuit resistor 123 is connected between a drain and source of the shunt FET stage 111. Moreover, a short circuit resistor 124 is connected between a drain and source of the shunt FET stage 112. Further, a short circuit resistor 125 is connected between a drain and source of the shunt FET stage 113. With this, the potentials of the drains and sources of the path switching FET stages 108 to 110 and the shunt FET stages 111 to 113 are set to be equal to one another. Regarding the short circuit resistors 120 to 125, only one resistor may be included, or no resistor may be included.

Operations of Diode-Switch Logic Circuit

In FIG. 1, the PN junction diodes 126 to 131, the inversion control switches 132 to 137, and the ground resistors 138 to 140 constitute a diode-switch logic circuit 100. The diode-switch logic circuit 100 operates as shown in the truth table of FIG. 2. More specifically, the diode-switch logic circuit 100 respectively applies the control voltages, respectively input to the control terminals 105 to 107, through the gate resistors 114 to 116 to the gates of the path switching FET stages 108 to 110 in order that at least one of the high-frequency signal paths between the common input-output terminal 101 and the respective individual input-output terminals 102 to 104 is caused to become the conducting state, and the other high-frequency signal paths are caused to become the cutoff state. In addition, the diode-switch logic circuit 100 respectively applies logic synthesis voltages, obtained by logic synthesis of the control voltages respectively input to the control terminals 105 to 107, through the gate resistors 117 to 119 to the gates of the shunt FET stages 111 to 113. The logic synthesis voltage is generated as a logical product (AND) of a logical negation (NOT) of the control voltage applied to an output target that is one of the shunt FET stages 111 to 113 and a logical sum (OR) of the control voltages applied to the remaining shunt FET stages other than the above one shunt FET stage.

For example, the control voltages input to the control terminals 105 to 107 are respectively the high level, the low level, and the low level. In this case, the path switching FET stage 108 becomes the conducting state, and the path switching FET stages 109 and 110 become the cutoff state. To be specific, the high-frequency signal path between the common input-output terminal 101 and the individual input-output terminal 102 becomes the conducting state (ON). Then, the high-frequency signal path between the common input-output terminal 101 and the individual input-output terminal 103 becomes the cutoff state (OFF), and the high-frequency signal path between the common input-output terminal 101 and the individual input-output terminal 104 becomes the cutoff state (OFF).

The gate voltage applied to the gate of the shunt FET stage 111 is generated by a first logic portion constituted by the diodes 126 and 127, the inversion control switches 132 and 133, and the ground resistor 138. To be specific, since the control voltage input to the control terminal 105 corresponding to the shunt FET stage 111 is the high level, the inversion control switches 132 and 133 become the cutoff state. Therefore, the gate voltage of the shunt FET stage 111 becomes a ground voltage (the low level) through the gate resistor 117 and the ground resistor 138, so that the shunt FET stage 111 becomes the cutoff state. In other words, the logical product (AND) of the low level that is the logical negation (NOT) of the control voltage (the high level) of the control terminal 105 and the low level that is the logical sum (OR) of the control voltages (the low level and the low level) of the remaining control terminals 106 and 107 other than the control terminal 105 is the low level, and the logic synthesis voltage of this low level is applied through the gate resistor 117 to the gate of the shunt FET stage 111. In order to realize this logic, the first logic portion is configured.

The gate voltage applied to the gate of the shunt FET stage 112 is generated by a second logic portion constituted by the diodes 128 and 129, the inversion control switches 134 and 135, and the ground resistor 139. To be specific, since the control voltage input to the control terminal 106 corresponding to the shunt FET stage 112 is the low level, the inversion control switches 134 and 135 become the conducting state. Therefore, the gate voltage of the shunt FET stage 112 becomes a voltage (the high level) which has dropped from the control voltage of the control terminal 105 by a forward voltage of the diode 129.

In other words, the logical product (AND) of the high level that is the logical negation (NOT) of the control voltage (the low level) of the control terminal 106 and the high level that is the logical sum (OR) of the control voltages (the high level and the low level) of the remaining control terminals 105 and 107 other than the control terminal 106 is the high level, and the logic synthesis voltage of this high level is applied through the gate resistor 118 to the gate of the shunt FET stage 112. In order to realize this logic, the second logic portion is configured.

The gate voltage applied to the gate of the shunt FET stage 113 is generated by a third logic portion constituted by the diodes 130 and 131, the inversion control switches 136 and 137, and the ground resistor 140. To be specific, since the control voltage input to the control terminal 107 corresponding to the shunt FET stage 113 is the low level, the inversion control switches 136 and 137 become the conducting state. Therefore, the gate voltage of the shunt FET stage 113 becomes a voltage (the high level) which has dropped from the control voltage of the control terminal 105 by a forward voltage of the diode 131.

In other words, the logical product (AND) of the high level that is the logical negation (NOT) of the control voltage (the low level) of the control terminal 107 and the high level that is the logical sum (OR) of the control voltages (the high level and the low level) of the remaining control terminals 105 and 106 other than the control terminal 107 is the high level, and the logic synthesis voltage of this high level is applied through the gate resistor 119 to the gate of the shunt FET stage 113. In order to realize this logic, the third logic portion is configured.

Cases of the other combinations of the control voltages input to the control terminals 105 to 107 as shown in FIG. 2 will be explained in the same manner as above.

Method of Producing PN Junction Diode

Figure 3A:
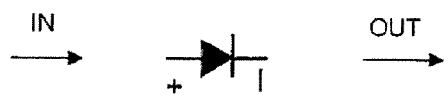
FIG. 3A is a circuit diagram showing one example of a diode of FIG. 1.
Figure 3B:
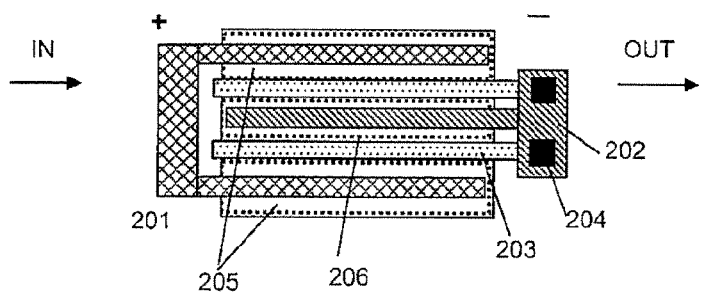
FIG. 3B is a plan view showing one example of the diode of FIG. 3A.
Figure 3C:
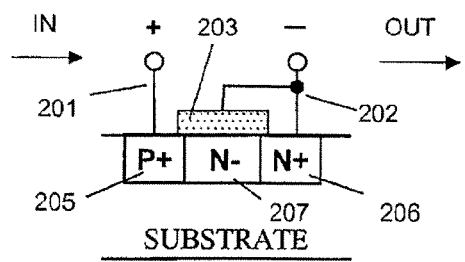
FIG. 3C is a cross-sectional view showing one example of the diode of FIG. 3A.

FIGS. 3A, 3B, and 3C are diagrams for explaining a method of forming the PN junction diodes 126 to 131 of the diode-switch logic circuit 100 on a SOS or SOI substrate.

In FIGS. 3B and 3C, a reference sign 201 denotes an anode-side wire of the diode, and a reference sign 202 denotes a cathode-side wire of the diode. A gate 203 is connected to the cathode-side wire 202 through a contact 204. The anode-side wire 201 is connected to a P+ region 205 in a silicon substrate, and the cathode-side wire 202 is connected to an N+ region 206 in the silicon substrate. An N− region 207 in the substrate is located immediately under the gate 203, and the P+ region 205 and the N+ region 206 are connected to each other via the N− region 207. The P+ region 205 and the N− region 207 form a PN junction, and this PN junction exhibits diode characteristics.

As above, the diode can be easily formed on the SOS or SOI substrate by the same production process as a normal MOSFET.

Detailed Operation Example 1 of High-Frequency Semiconductor Switching Circuit

A case where one of three high-frequency signal paths is caused to become the conducting state will be explained as Detailed Operation Example 1 of the high-frequency semiconductor switching circuit of FIG. 1.

The following assumes a case where the high-frequency signal path between the common input-output terminal 101 and the individual input-output terminal 102 is the cutoff state, the high-frequency signal path between the common input-output terminal 101 and the individual input-output terminal 103 is the cutoff state, and the high-frequency signal path between the common input-output terminal 101 and the individual input-output terminal 104 is the conducting state.

In this case, the control voltage applied to the control terminal 107 is the high level, and the control voltages applied to the control terminals 105 and 106 are the low level. Therefore, the path switching FET stages 108 and 109 become the cutoff state, and the path switching FET stage 110 becomes the conducting state. Moreover, the inversion control switches 132 and 133 become the conducting state.

When the control voltage higher than a forward voltage of the PN junction diode 126 is applied to the control terminal 107, the PN junction diode 126 is turned on, and the cathode side of the PN junction diode 126 is maintained at a voltage which has dropped from the control voltage of the control terminal 107 by the forward voltage of the PN junction diode 126. Then, this voltage is applied through the inversion control switch 132 and the gate resistor 117 to the gate of the shunt BET stage 111. For example, in a case where the PN junction diode 126 is a PN junction diode formed on a silicon substrate, the forward voltage of about 0.6 V is generated for each diode. Therefore, when the control voltage applied to the control terminal 107 is about 3 V (the high level), the gate voltage of the shunt FET stage 111 becomes about 2.4 V (=3−0.6) adequately higher than the pinch-off voltage. Therefore, the shunt FET stage 111 becomes the conducting state.

Since the control voltage applied to the control terminal 106 is the low level, the potential of the anode side of the PN junction diode 127 becomes the low level, and the potential of the cathode side thereof becomes substantially equal to the potential of the cathode side of the PN junction diode 126. Since the control voltage applied to the control terminal 106 is the low level, the inversion control switches 134 and 135 become the conducting state.

When the control voltage higher than a forward voltage of the PN junction diode 128 is applied to the control terminal 107, the PN junction diode 128 is turned on, and the cathode side of the PN junction diode 128 is maintained at a voltage which has dropped from the control voltage of the control terminal 107 by the forward voltage of the PN junction diode 128. Then, this voltage is applied through the inversion control switch 134 and the gate resistor 118 to the gate of the shunt FET stage 112. For example, when the control voltage applied to the control terminal 107 is about 3 V (the high level), the gate voltage of the shunt FET stage 112 becomes about 2.4 V adequately higher than the pinch-off voltage, and the shunt FET stage 112 becomes the conducting state.

Since the control voltage applied to the control terminal 105 is the low level, the potential of the anode side of the PN junction diode 129 becomes the low level, and the potential of the cathode side thereof becomes substantially equal to the potential of the cathode side of the PN junction diode 128. Next, since the control voltage applied to the control terminal 107 is the high level, the inversion control switches 136 and 137 become the cutoff state, and the gate of the shunt FET stage 113 is connected through the gate resistors 119 and 140 to the ground. Therefore, since the gate voltage of the shunt FET stage 113 becomes adequately lower than the pinch-off voltage, the shunt FET stage 113 becomes the cutoff state.

The above operations will be explained in accordance with the truth table of FIG. 2.

The gate voltage of the shunt FET stage 111 becomes the high level that is the logical product (AND) of the high level that is the logical negation (NOT) of the control voltage (the low level) of the control terminal 105 and the high level that is the logical sum (OR) of the control voltages (the low level and the high level) of the remaining control terminals 106 and 107 other than the control terminal 105. Therefore, the path switching FET stage 108 becomes the cutoff state whereas the shunt FET stage 111 corresponding to the path switching FET stage 108 becomes the conducting state.

The gate voltage of the shunt FET stage 112 becomes the high level that is the logical product (AND) of the high level that is the logical negation (NOT) of the control voltage (the low level) of the control terminal 106 and the high level that is the logical sum (OR) of the control voltages (the low level and the high level) of the remaining control terminals 105 and 107 other than the control terminal 106. Therefore, the path switching FET stage 109 becomes the cutoff state whereas the shunt FET stage 112 corresponding to the path switching FET stage 109 becomes the conducting state.

The gate voltage of the shunt FET stage 113 becomes the low level that is the logical product (AND) of the low level that is the logical negation (NOT) of the control voltage (the high level) of the control terminal 107 and the low level that is the logical sum (OR) of the control voltages (the low level and the low level) of the remaining control terminals 105 and 106 other than the control terminal 107. Therefore, the path switching PET stage 110 becomes the conducting state whereas the shunt FET stage 113 corresponding to the path switching FET stage 110 becomes the cutoff state.

Detailed Operation Example 2 of High-Frequency Semiconductor Switching Circuit

Next, a case where two or more out of three high-frequency signal paths are caused to become the conducting state will be explained as Detailed Operation Example 2 of the high-frequency semiconductor switching circuit of FIG. 1.

For example, the following assumes a case where the high-frequency signal path between the common input-output terminal 101 and the individual input-output terminal 102 is the cutoff state, the high-frequency signal path between the common input-output terminal 101 and the individual input-output terminal 103 is the conducting state, and the high-frequency signal path between the common input-output terminal 101 and the individual input-output terminal 104 is the conducting state.

In this case, the control voltage applied to the control terminal 105 is the low level, and the control voltages applied to the control terminals 106 and 107 are the high level. At this time, the path switching FET stage 108 becomes the cutoff state, and the path switching FET stages 109 and 110 become the conducting state. The inversion control switches 132 and 133 become the conducting state.

When the control voltage (the high level) higher than the forward voltage of the PN junction diode 126 is applied to the control terminal 107, the PN junction diode 126 is turned on, and the cathode side of the PN junction diode 126 is maintained at a voltage which has dropped from the control voltage (the high level) of the control terminal 107 by the forward voltage of the PN junction diode 126. Then, this voltage is applied through the inversion control switch 132 and the gate resistor 117 to the gate of the shunt FET stage 111. For example, when the control voltage applied to the control terminal 107 is about 3 V (the high level), the gate voltage of the shunt FET stage 111 is about 2.4 V (the high level) adequately higher than the pinch-off voltage.

When the control voltage (the high level) higher than a forward voltage of the PN junction diode 127 is applied to the control terminal 106, the PN junction diode 127 is turned on, and the cathode of the PN junction diode 127 is maintained at a voltage which has dropped from the control voltage of the control terminal 106 by the forward voltage of the PN junction diode 127. Then, this voltage is applied through the inversion control switch 133 and the gate resistor 117 to the gate of the shunt FET stage 111. For example, when the control voltage applied to the control terminal 106 is about 3 V (the high level), the gate voltage of the shunt FET stage 111 becomes about 2.4 V (the high level) adequately higher than the pinch-off voltage.

As above, even in a case where the control terminals 106 and 107 become the high level at the same time, the forward voltages generated at the PN junction diodes 126 and 127 are maintained, so that the gate voltage of the shunt FET stage 111 becomes substantially constant. Therefore, the shunt FET stage 111 becomes the conducting state.

Since the control voltage applied to the control terminal 106 is the high level, the inversion control switches 134 and 135 become the cutoff state, and the gate of the shunt FET stage 112 is connected through the gate resistors 118 and 139 to the ground. Therefore, since the gate voltage of the shunt FET stage 112 is adequately lower than the pinch-off voltage, the shunt FET stage 112 becomes the cutoff state.

Since the control voltage applied to the control terminal 107 is the high level, the inversion control switches 136 and 137 become the cutoff state, and the gate of the shunt FET stage 113 is connected through the gate resistors 119 and 140 to the ground. Therefore, since the gate voltage of the shunt FET stage 113 is adequately lower than the pinch-off voltage, the shunt FET stage 113 becomes the cutoff state.

The above operations will be explained in accordance with the truth table of FIG. 2. The gate voltage of the shunt FET stage 111 becomes the high level that is the logical product (AND) of the high level that is the logical negation (NOT) of the control voltage (the low level) of the control terminal 105 and the high level that is the logical sum (OR) of the control voltages (the high level and the high level) of the remaining control terminals 106 and 107 other than the control terminal 105. Therefore, the path switching FET stage 108 becomes the cutoff state whereas the shunt FET stage 111 corresponding to the path switching FET stage 108 becomes the conducting state.

The gate voltage of the shunt FET stage 112 becomes the low level that is the logical product (AND) of the low level that is the logical negation (NOT) of the control voltage (the high level) of the control terminal 106 and the high level that is the logical sum (OR) of the control voltages (the low level and the high level) of the remaining control terminals 105 and 107 other than the control terminal 106. Therefore, the path switching FET stage 109 becomes the cutoff state whereas the shunt FET stage 112 corresponding to the path switching FET stage 109 becomes the cutoff state.

The gate voltage of the shunt FET stage 113 becomes the low level that is the logical product (AND) of the low level that is the logical negation (NOT) of the control voltage (the high level) of the control terminal 107 and the low level that is the logical sum (OR) of the control voltages (the low level and the low level) of the remaining control terminals 105 and 106 other than the control terminal 107. Therefore, the path switching FET stage 110 becomes the conducting state whereas the shunt FET stage 113 corresponding to the path switching FET stage 110 becomes the cutoff state.

As with the above, even in a case where at least one of the high-frequency signal path between the common input-output terminal 101 and the individual input-output terminal 102, the high-frequency signal path between the common input-output terminal 101 and the individual input-output terminal 103, and the high-frequency signal path between the common input-output terminal 101 and the individual input-output terminal 104 is caused to become the conducting state, the path switching FET stages 108 to 110 and the shunt PET stages 111 to 113 can be caused to normally become the conducting state or the cutoff state in accordance with the truth table of FIG. 2.

The high-frequency semiconductor switching circuit according to the present embodiment is different from the conventional high-frequency semiconductor switching circuits as below.

Figure 14:
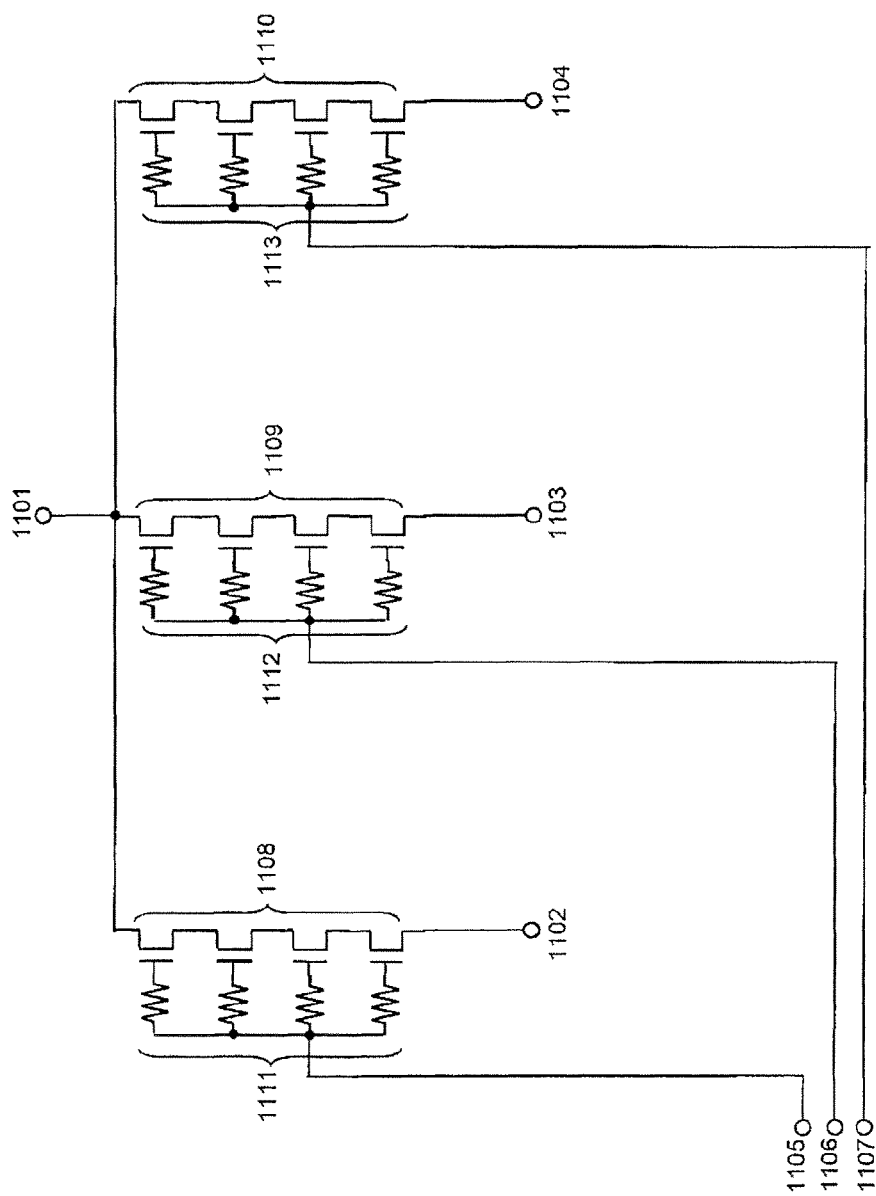
FIG. 14 is a circuit diagram showing Configuration Example 1 of a conventional high frequency semiconductor switching circuit.

In Conventional Configuration Example 1 shown in FIG. 14, since a shunt FET does not exist, it is difficult to improve the isolation property without deteriorating the insertion loss.

Figure 15:
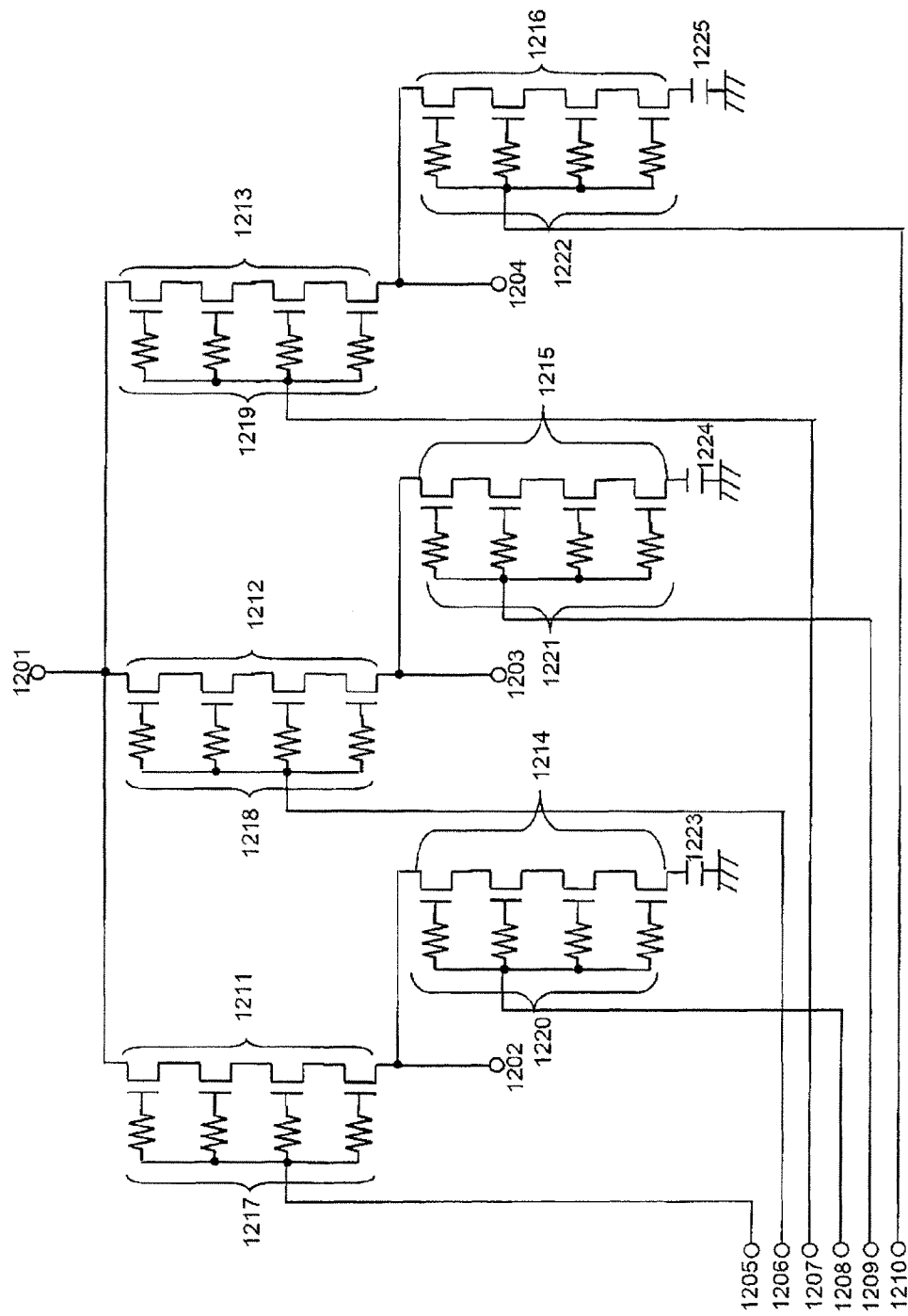
FIG. 15 is a circuit diagram showing Configuration Example 2 of the conventional high-frequency semiconductor switching circuit as shown in FIG. 14 of Japanese Patent No. 4105183.

In Conventional Configuration Example 2 shown in FIG. 15, six control terminals are required to improve the isolation property.

Figure 17:
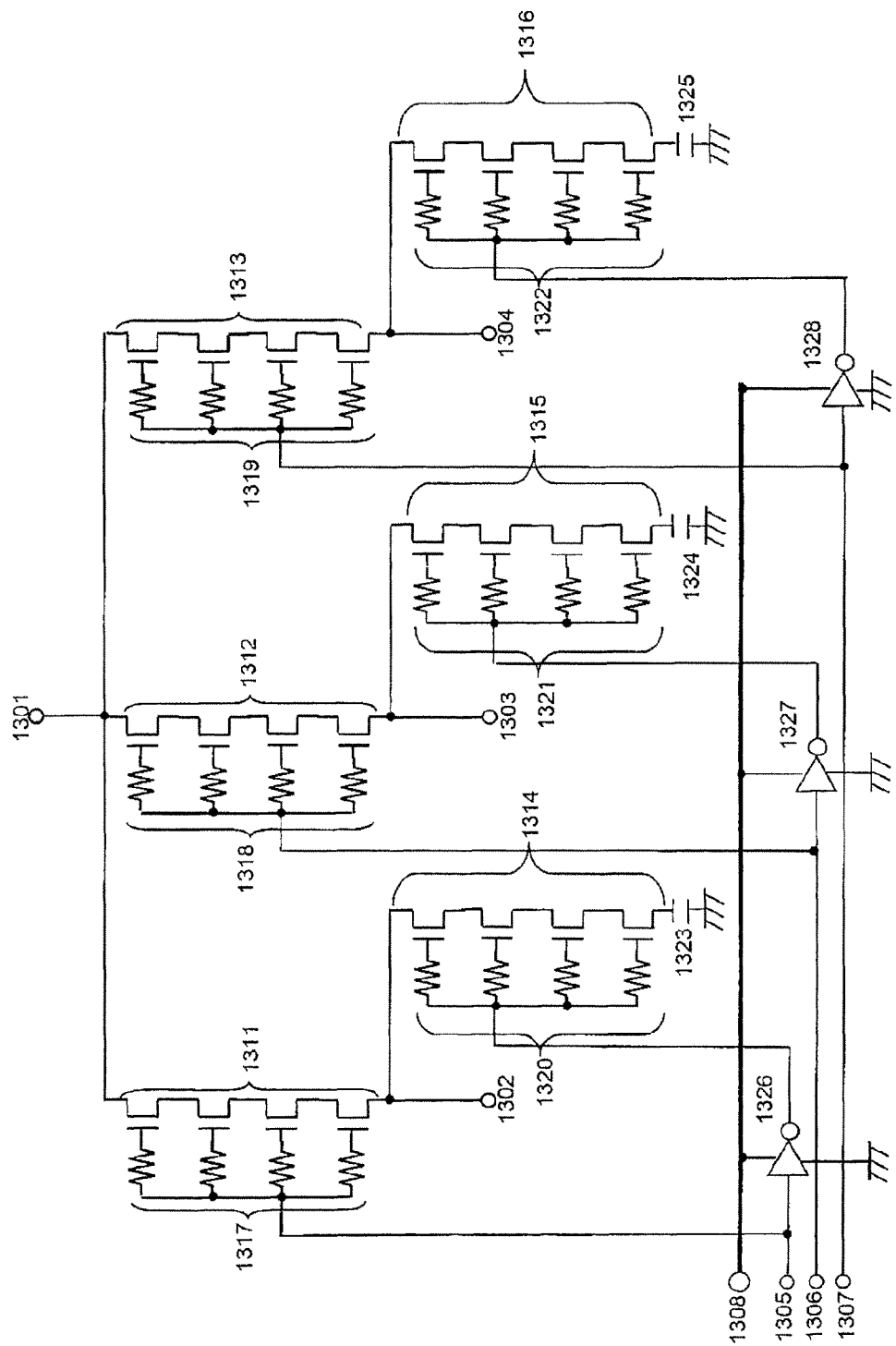
FIG. 17 is a circuit diagram showing Configuration Example 3 of the conventional high-frequency semiconductor switching circuit.
Figure 18:
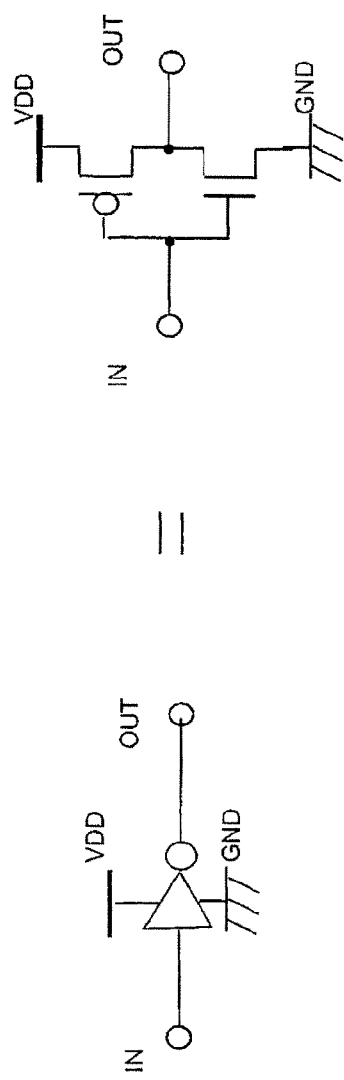
FIG. 18 is a circuit diagram showing a configuration example of an inverter circuit of FIG. 17.

In Conventional Configuration Example 3 shown in FIG. 17, since the gate voltages of respective shunt FETs constituting the shunt FET stages are generated by using the inverter circuits 1326 to 1328, the power supply terminal 1308 configured to cause the inverter circuits 1326 to 1328 to operate is required.

Figure 19:
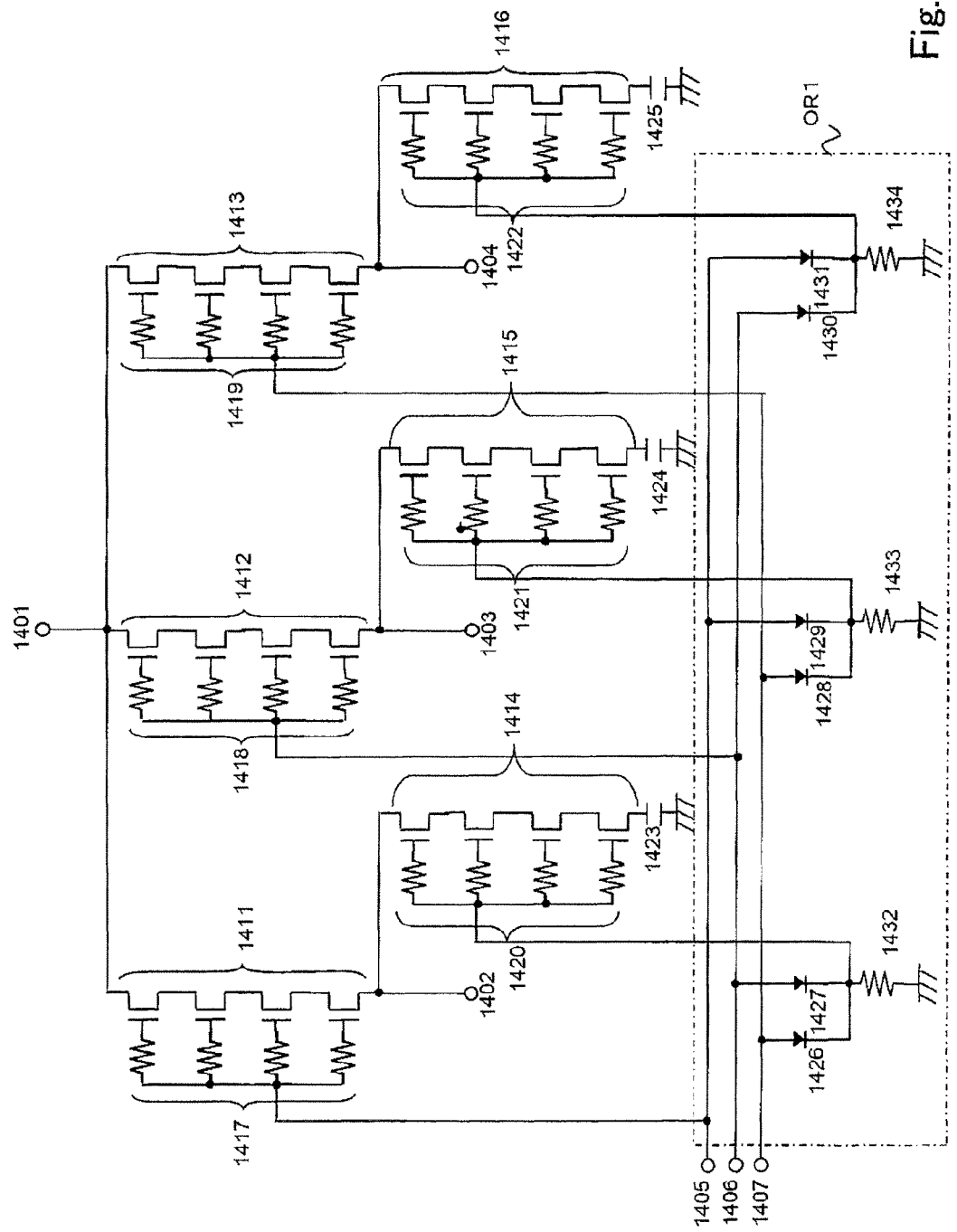
FIG. 19 is a circuit diagram showing Configuration Example 4 of the conventional high-frequency semiconductor switching circuit.

In Conventional Configuration Example 4 shown in FIG. 19, two or more high-frequency signal paths cannot be caused to become the conducting state at the same time.

In contrast, in the high-frequency semiconductor switching circuit according to the present embodiment, six FETs (108 to 113) can be controlled only by three control terminals (105 to 107) without adding the power supply terminal 1308 shown in FIG. 17, and two or more high-frequency signal paths can be caused to become the conducting state at the same time.

FIG. 4 shows graphs of comparison between the present embodiment and Conventional Configuration Example 1 of FIG. 14 regarding the insertion loss and the isolation property. In the graphs, a solid line denotes the present embodiment, and a dotted line denotes Conventional Configuration Example 1 of FIG. 14. It is clear from the graphs that according to the present embodiment, the isolation property can be improved by 10 dB or more without increasing the number of terminals, cutting the function of turning on two or more switches at the same time, and deteriorating the value of the insertion loss from Conventional Configuration Example 1.

As above, according to the present embodiment, the diode-switch logic circuit 100 performs the logic synthesis of three or more control voltages respectively input to three or more control terminals (105 to 107). With this, one or more shunt FET stages (111 to 113) for securing the isolation can be controlled based on three or more control voltages respectively applied to the gates of three or more path switching FET stages (108 to 110). To be specific, since the gate voltage(s) of one or more shunt FET stages (111 to 113) can be prepared by utilizing the control voltages respectively applied to the gates of three or more path switching FET stages (108 to 110), a power supply circuit including a power supply terminal and its wire are unnecessary. With this, the high-frequency semiconductor switching circuit can be reduced in size, and therefore, a mobile communication device including the high-frequency semiconductor switching circuit can be reduced in size, and the power consumption can be reduced. Further, unlike Conventional Configuration Example 4, two or more path switching FET stages (108 to 110) can be caused to become the conducting state at the same time. Thus, the high-function high-frequency switching circuit can be realized while maintaining satisfactory properties, such as the low insertion loss, the high isolation, and the low strain.

Modification Example 1

Figure 5:
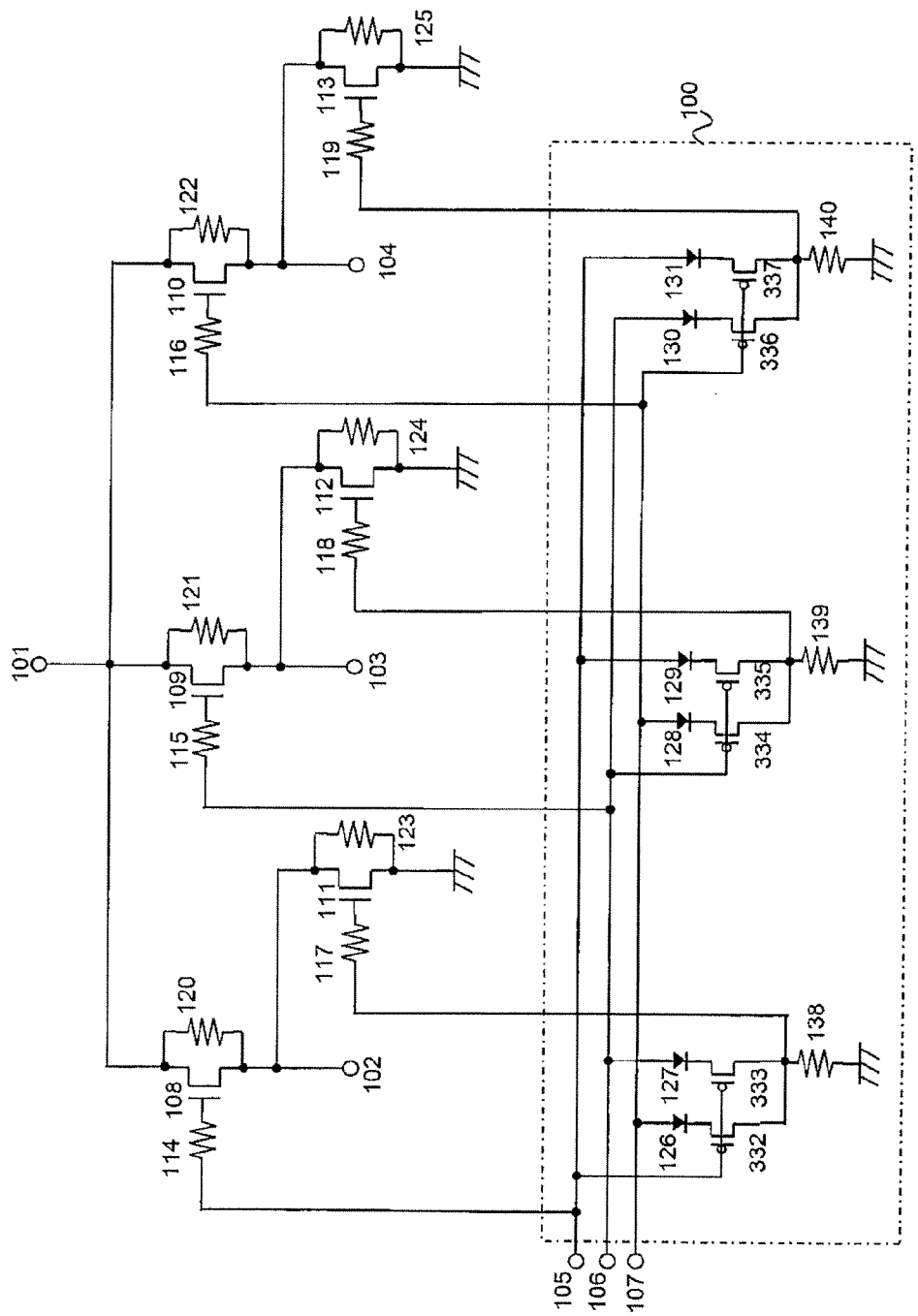
FIG. 5 is a circuit diagram showing Modification Example 1 of the high-frequency semiconductor switching circuit according to Embodiment 1 of the present invention.

FIG. 5 is a circuit diagram showing Modification Example 1 of the high-frequency semiconductor switching circuit according to Embodiment 1 of the present invention. In the high-frequency semiconductor switching circuit of FIG. 5, PMOSFETs 332 to 337 formed on a SOS or SOI semiconductor substrate are used instead of the inversion control switches 132 to 137 shown in FIG. 1.

A drain of the PMOSFET 332 is connected to the cathode side of the PN junction diode 126, a gate thereof is connected to the control terminal 105, and a source thereof is connected through the gate resistor 117 to the shunt FET stage 111. A drain of the PMOSFET 333 is connected to the cathode side of the PN junction diode 127, a gate thereof is connected to the control terminal 105, and a source thereof is connected through the gate resistor 117 to the shunt FET stage 111.

A drain of the PMOSFET 334 is connected to the cathode side of the PN junction diode 128, a gate thereof is connected to the control terminal 106, and a source thereof is connected through the gate resistor 118 to the shunt FET stage 112. A drain of the PMOSFET 335 is connected to the cathode side of the PN junction diode 129, a gate thereof is connected to the control terminal 106, and a source thereof is connected through the gate resistor 118 to the shunt FET stage 112.

A drain of the PMOSFET 336 is connected to the cathode side of the PN junction diode 130, a gate thereof is connected to the control terminal 107, and a source thereof is connected through the gate resistor 119 to the shunt FET stage 113. A drain of the PMOSFET 337 is connected to the cathode of the PN junction diode 131, a gate thereof is connected to the control terminal 107, and a source thereof is connected through the gate resistor 119 to the shunt FET stage 113.

Body potentials of the PMOSFETs 332 to 337 are floating. In the case of a PMOSFET formed on a normal silicon substrate which is low in specific resistance (electrical resistivity), the body potential needs to be connected to the highest potential, such as a power supply terminal, in a circuit to prevent latch-up. However, in the case of a PMOSFET formed on a SOS or SOI substrate which becomes high in specific resistance as it gets close to an insulator, elements are completely separated from one another, so that no problem occurs even if the body potential is floating.

As above, the inversion control switch configured to become the off state when the control voltage is the high level and become the on state when the control voltage is the low level can be easily realized by using the PMOSFET without providing an additional power supply terminal for preventing the latch-up.

Modification Example 2

Figure 6:
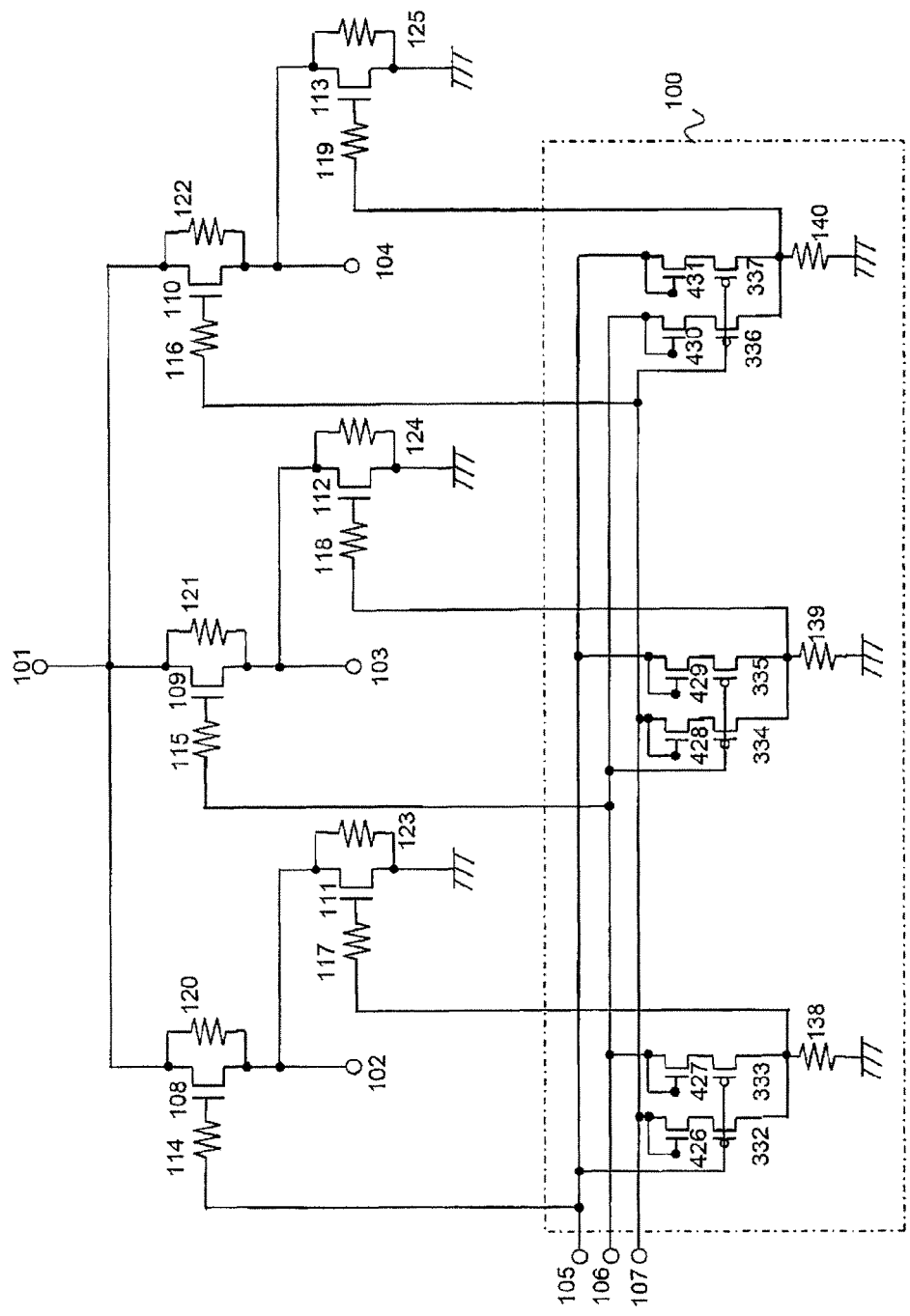
FIG. 6 is a circuit diagram showing Modification Example 2 of the high-frequency semiconductor switching circuit according to Embodiment 1 of the present invention.

FIG. 6 is a circuit diagram showing Modification Example 2 of the high-frequency semiconductor switching circuit according to Embodiment 1 of the present invention. In the high-frequency semiconductor switching circuit of FIG. 6, diode-connected NMOSFETs 426 to 431 are used instead of the PN junction diodes 126 to 131 shown in FIG. 5.

A gate and drain of the NMOSFET 426 are short-circuited and connected to the control terminal 107, and a source thereof is connected to the drain of the PMOSFET 332. A gate and drain of the NMOSFET 427 are short-circuited and connected to the control terminal 106, and a source thereof is connected to the drain of the PMOSFET 333.

A gate and drain of the NMOSFET 428 are short-circuited and connected to the control terminal 107, and a source thereof is connected to the drain of the PMOSFET 334. A gate and drain of the NMOSFET 429 are short-circuited and connected to the control terminal 105, and a source thereof is connected to the drain of the PMOSFET 335.

A gate and drain of the NMOSFET 430 are short-circuited and connected to the control terminal 106 and a source thereof is connected to the drain of the PMOSFET 336. A gate and drain of the NMOSFET 431 are short-circuited and connected to the control terminal 105, and a source thereof is connected to the drain of the PMOSFET 337.

A NMOSFET generally operates in the same manner as a diode by short-circuiting (diode-connecting) a gate and drain thereof. Generally, in the case of a PN junction diode formed on a silicon substrate, the forward voltage of about 0.6 V is generated for each diode. In contrast, in the case of the diode-connected MOSFET, the forward voltage can be controlled by adjusting the gate length, gate width, and pinch-off voltage of the NMOSFET. For example, in the NMOSFET in which the gate length is 0.25 μm, and the pinch-off voltage is 0.3 V, the forward voltage becomes 0.3 to 0.6 V. Therefore, the voltage drop of the NMOSFET can be made smaller than that of the PN junction diode. As a result, the voltage applied to the gate electrode of the shunt FET stage can be increased, which is effective for the isolation property.

Modification Example 3

Figure 7:
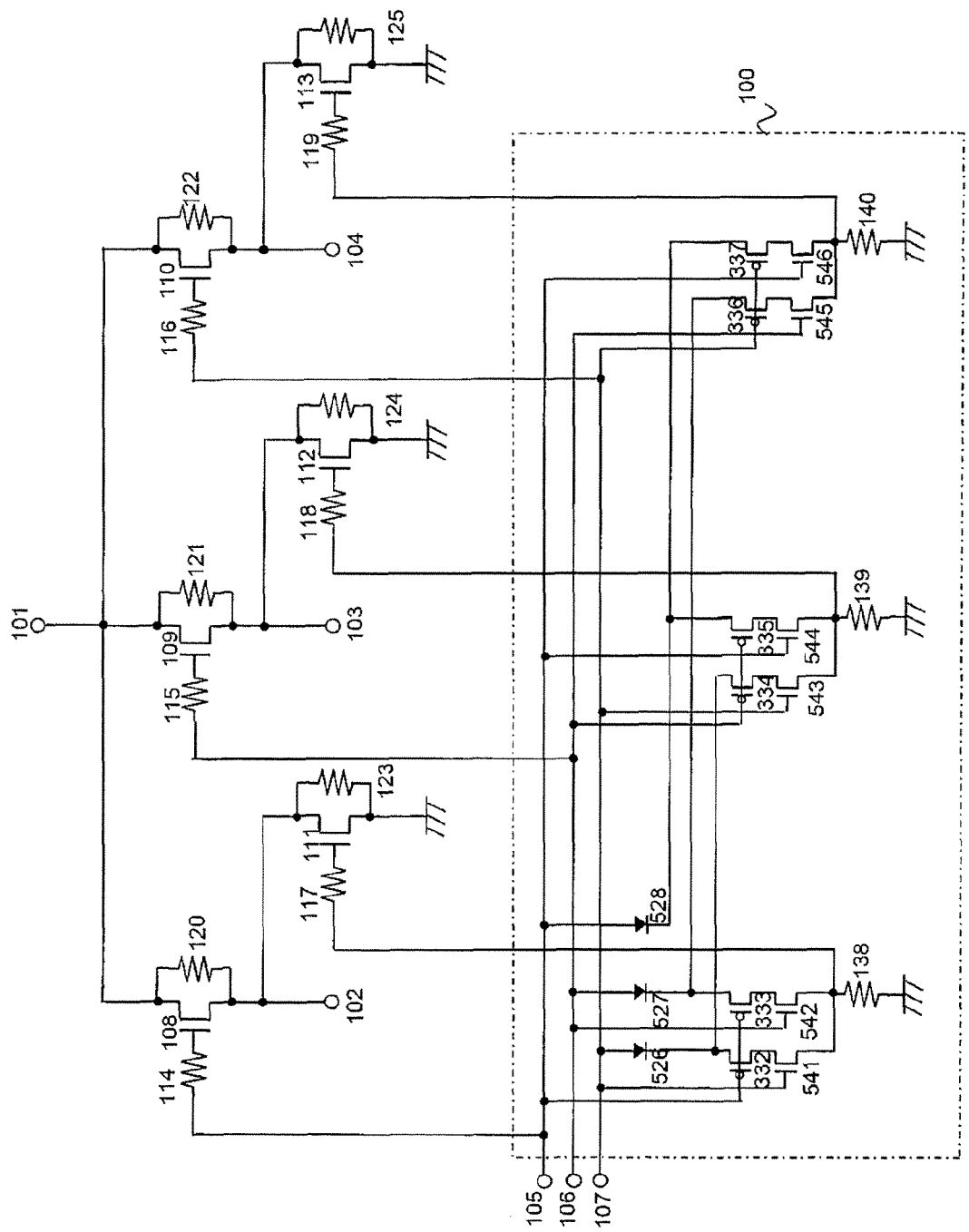
FIG. 7 is a circuit diagram showing Modification Example 3 of the high-frequency semiconductor switching circuit according to Embodiment 1 of the present invention.

FIG. 7 is a circuit diagram showing Modification Example 3 of the high-frequency semiconductor switching circuit according to Embodiment 1 of the present invention. In the high-frequency semiconductor switching circuit of FIG. 7, the number of PN junction diodes of the diode-switch logic circuit 100 of FIG. 5 is reduced from six to three, but NMOSFETs 541 to 546 are added instead.

An anode side of a diode 526 is connected to the control terminal 107, and a cathode side thereof is connected to the drain of the PMOSFET 332 and the drain of the PMOSFET 334. An anode side of a diode 527 is connected to the control terminal 106, and a cathode side thereof is connected to the drain of the PMOSFET 333 and the drain of the PMOSFET 336. An anode side of a diode 528 is connected to the control terminal 105, and a cathode side thereof is connected to the drain of the PMOSFET 335 and the drain of the PMOSFET 337.

The sources of the PMOSFETs 332 to 337 are respectively connected to drains of the NMOSFETs 541 to 546. Sources of the NMOSFETs 541 and 542 are short-circuited and connected through the gate resistor 117 to the shunt FET stage 111. Sources of the NMOSFETs 543 and 544 are short-circuited and connected through the gate resistor 118 to the shunt FET stage 112. Sources of the NMOSFETs 545 and 546 are short-circuited and connected through the gate resistor 119 to the shunt FET stage 113. A gate of the NMOSFET 541 is connected to the control terminal 107, and a gate of the NMOSFET 542 is connected to the control terminal 106. A gate of the NMOSFET 543 is connected to the control terminal 107, and a gate of the NMOSFET 544 is connected to the control terminal 105. A gate of the NMOSFET 545 is connected to the control terminal 106, and a gate of the NMOSFET 546 is connected to the control terminal 105.

The high-frequency semiconductor switching circuit showing the same logic as the truth table shown in FIG. 2 can be realized even by the above circuit configuration.

Modification Example 4

Figure 8:
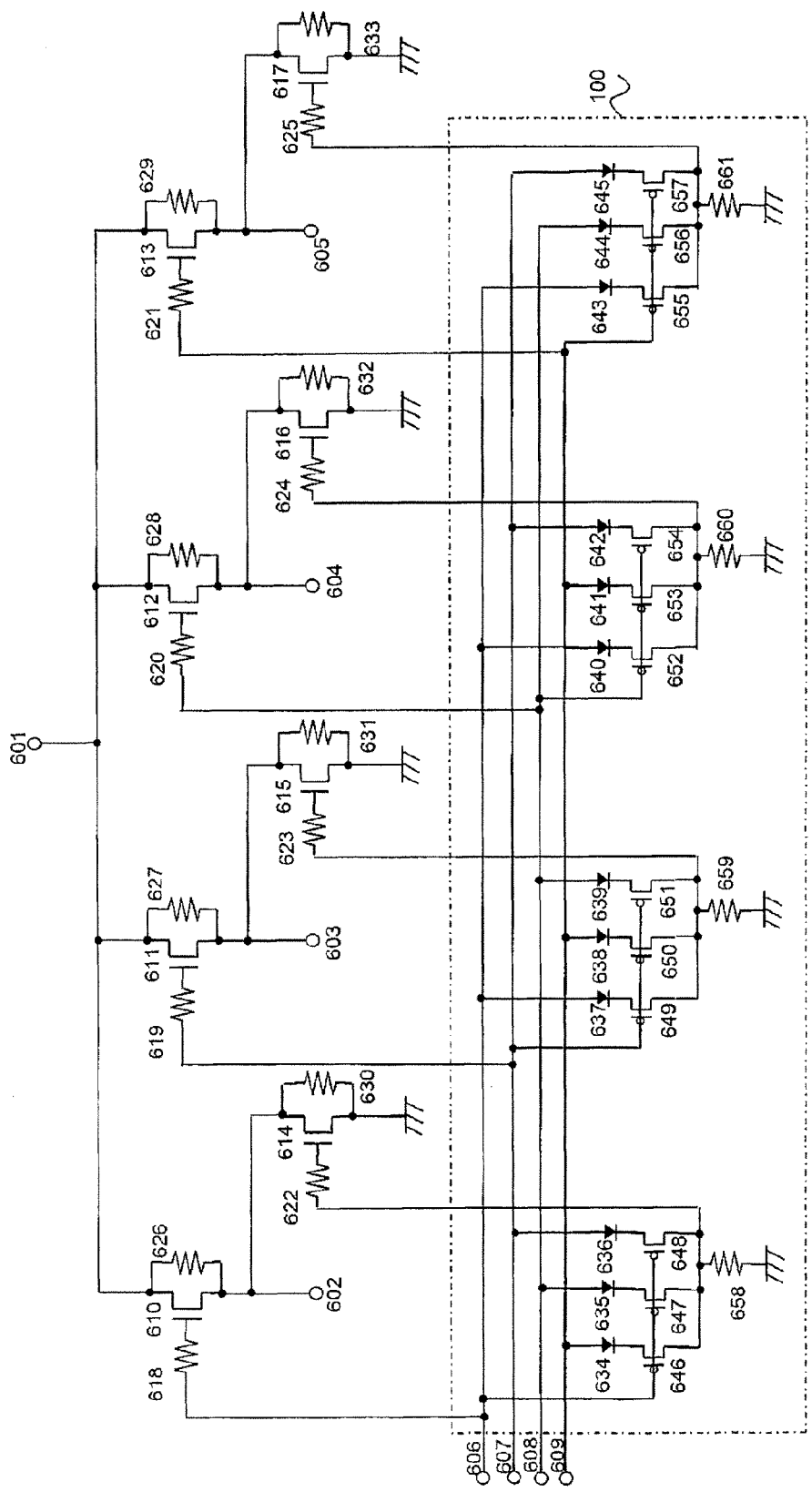
FIG. 8 is a circuit diagram showing Modification Example 4 of the high-frequency semiconductor switching circuit according to Embodiment 1 of the present invention.

FIG. 8 is a circuit diagram showing Modification Example 4 of the high-frequency semiconductor switching circuit according to Embodiment 1 of the present invention. The high-frequency semiconductor switching circuit of FIG. 8 is configured by applying the configuration of FIG. 5 to a SP4T (Single-Pole Four-Throw) switch including one input and four outputs.

In FIG. 8, a reference sign 601 denotes a common input-output terminal, reference signs 602 to 605 denote individual input-output terminals, and reference signs 606 to 609 denote control terminals.

Reference signs 610 to 613 denote path switching FET stages, reference signs 614 to 617 denote shunt FET stages, reference signs 618 to 625 denote gate resistors, and reference signs 626 to 633 denote short circuit resistors. Diodes 634 to 645 and PMOSFETs 646 to 657 constitute the diode-switch logic circuit 100. Reference signs 658 to 661 denote ground resistors inserted between respective sources of the PMOSFETs 646 to 657 and the ground.

As above, in the present embodiment, the high-frequency semiconductor switching circuit is not limited to the SP3T switch including one input and three outputs. The present embodiment is applicable to a wide range of multi-input multi-output high-frequency semiconductor switching circuits, such as the SP4T switch.

Modification Example 5

Figure 9:
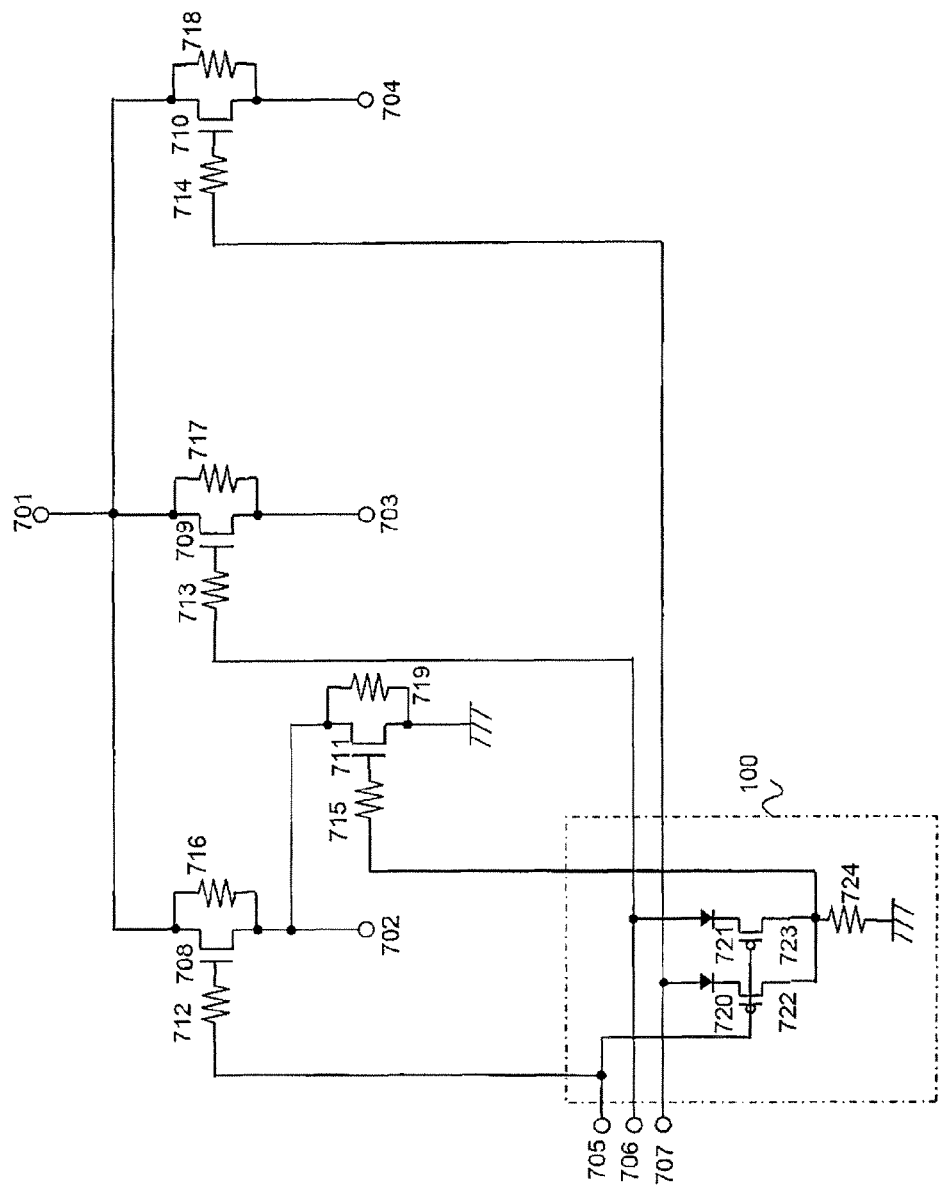
FIG. 9 is a circuit diagram showing Modification Example 5 of the high-frequency semiconductor switching circuit according to Embodiment 1 of the present invention.

FIG. 9 is a circuit diagram showing Modification Example 5 of the high-frequency semiconductor switching circuit according to Embodiment 1 of the present invention. The high-frequency semiconductor switching circuit of FIG. 9 is a SP3T switch configured such that unlike the configuration of FIG. 5, only one shunt FET stage for securing the isolation is provided for one high-frequency signal path. To be specific, in the above embodiment, the shunt FET stages are respectively connected to the high-frequency signal paths, but the above embodiment is applicable to a case where one shunt FET stage is connected to one specific high-frequency signal path.

Modification Example 6

Figure 10:
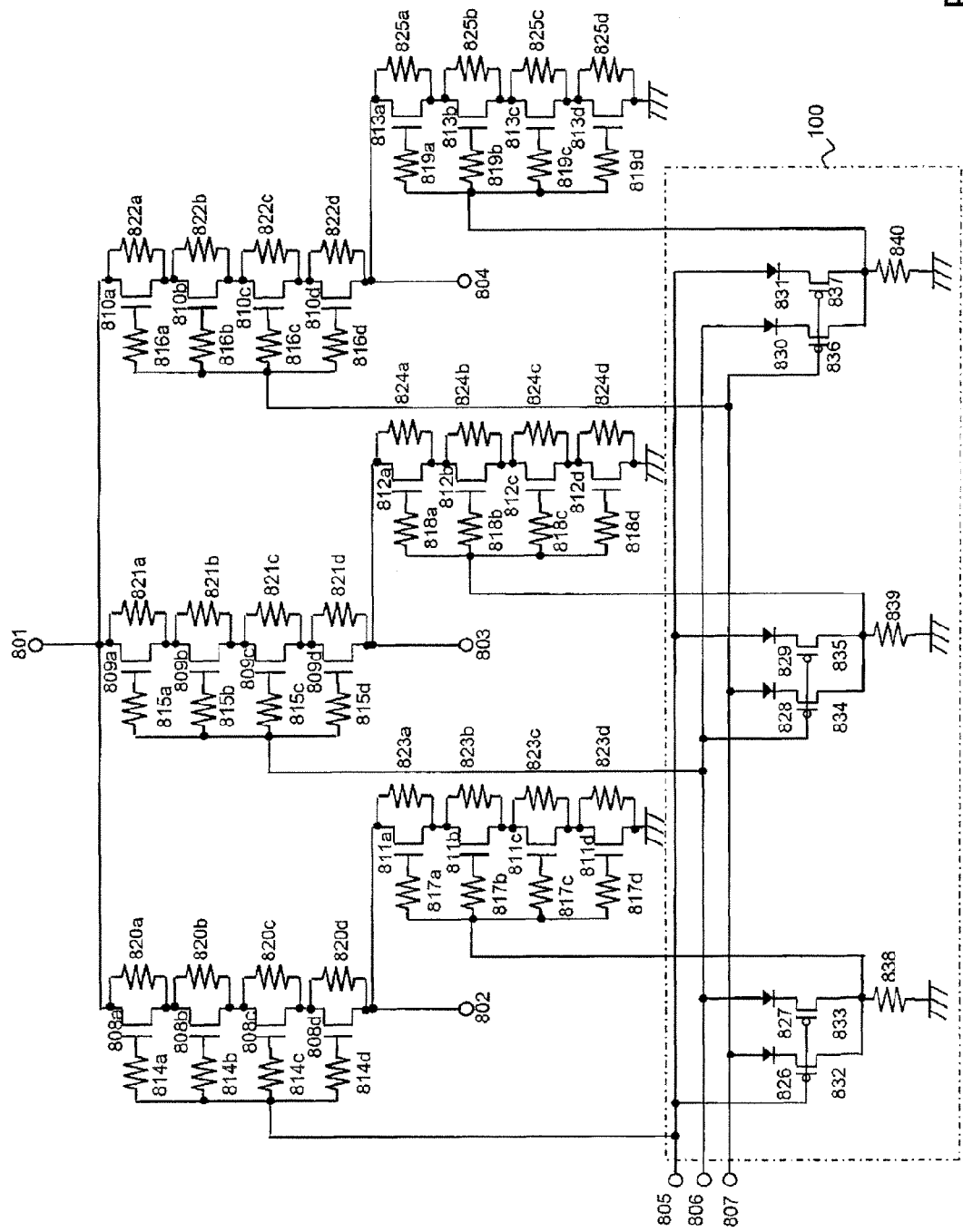
FIG. 10 is a circuit diagram showing Modification Example 6 of the high-frequency semiconductor switching circuit according to Embodiment 1 of the present invention.

FIG. 10 is a circuit diagram showing Modification Example 6 of the high-frequency semiconductor switching circuit according to Embodiment 1 of the present invention. The high-frequency semiconductor switching circuit of FIG. 10 is configured such that unlike the configuration of FIG. 5, each of three path switching FET stages and three shunt FET stages is configured by connecting four MOSFETs in series. To be specific, the above embodiment has explained a case where each of the path switching FET stages and the shunt FET stages provided for respective high-frequency signal paths is constituted by one MOSFET. However, the above embodiment is applicable to a case where two or more MOSFETs are connected in series. By configuring each of the path switching FET stages and the shunt FET stages by connecting a plurality of MOSFETs in series as above, the isolation property and the withstand voltage are improved.

Embodiment 2

Configuration of High-Frequency Semiconductor Switching Circuit

Figure 11:
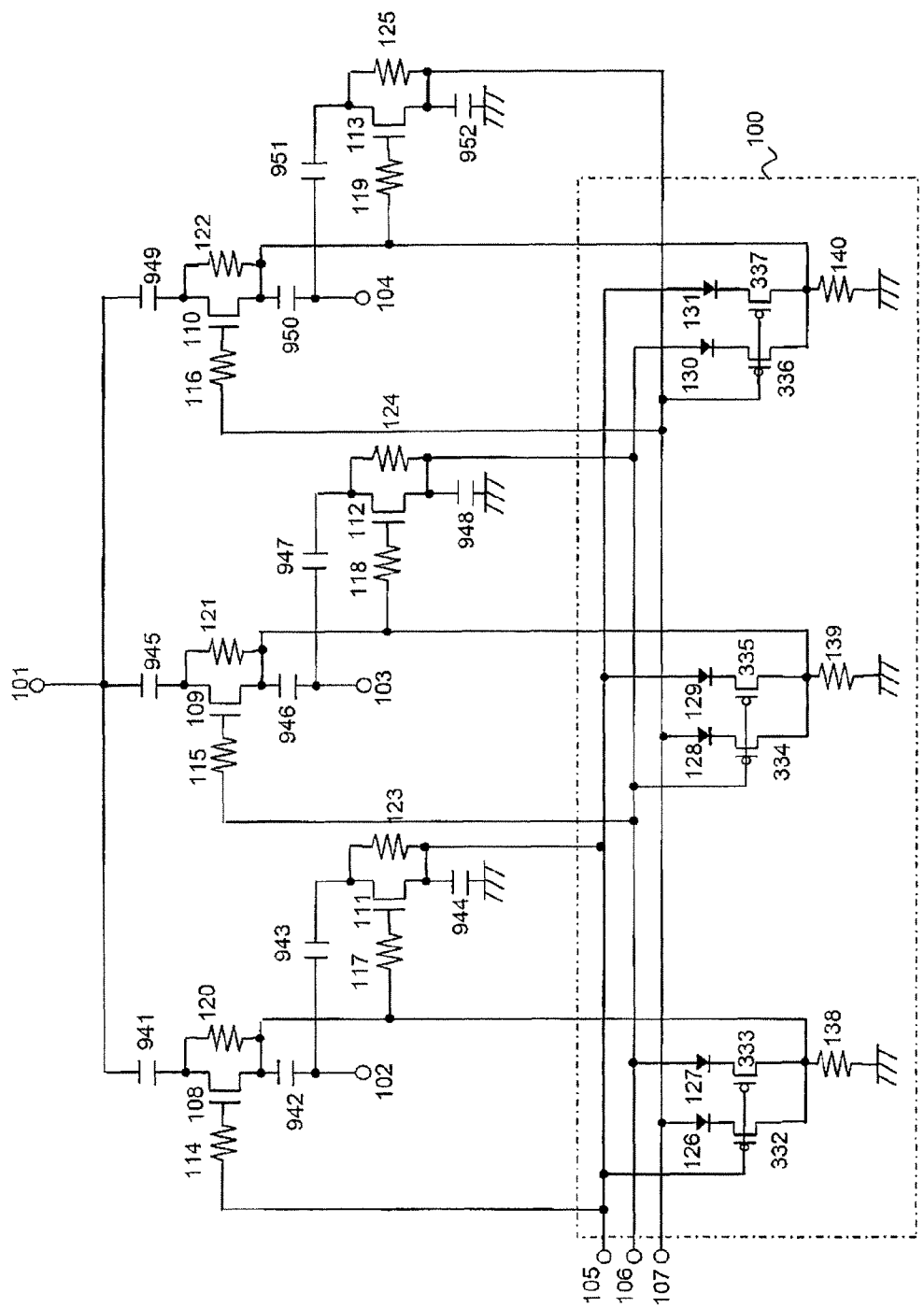
FIG. 11 is a circuit diagram showing a configuration example of the high-frequency semiconductor switching circuit according to Embodiment 2 of the present invention.

FIG. 11 is a circuit diagram showing a configuration example of the high-frequency semiconductor switching circuit according to Embodiment 2 of the present invention.

The high-frequency semiconductor switching circuit of FIG. 11 includes the common input-output terminal 101, the individual input-output terminals 102 to 104, the control terminals 105 to 107, the path switching FET stages 108 to 110, the shunt FET stages 111 to 113, the gate resistors 114 to 116, the gate resistors 117 to 119, the short circuit resistors 120 to 122, the short circuit resistors 123 to 125, the PN junction diodes 126 to 131, the PMOSFETs 332 to 337 and the ground resistors 138 to 140. These components are the same as those of the high-frequency semiconductor switching circuit of FIG. 5.

A short-circuit point where the drain of the PMOSFET 332 and the drain of the PMOSFET 333 are short-circuited is connected not only to the ground resistor 138 and the gate resistor 117 but also to the source of the path switching FET stage 108 and to the drain of the path switching FET stage 108 through the short circuit resistor 120.

A short-circuit point where the drain of the PMOSFET 334 and the drain of the PMOSFET 335 are short-circuited is connected not only to the ground resistor 139 and the gate resistor 118 but also to the source of the path switching FET stage 109 and to the drain of the path switching FET stage 109 through the short circuit resistor 121.

A short-circuit point where the drain of the PMOSFET 336 and the drain of the PMOSFET 337 are short-circuited is connected not only to the ground resistor 140 and the gate resistor 119 but also to the source of the path switching FET stage 110 and to the drain of the path switching FET stage 110 through the short circuit resistor 122.

The control terminal 105 is connected to the source of the shunt FET stage 111 and also connected to the drain of the shunt FET stage 111 through the short circuit resistor 123.

The control terminal 106 is connected to the source of the shunt FET stage 112 and also connected to the drain of the shunt FET stage 112 through the short circuit resistor 124.

The control terminal 107 is connected to the source of the shunt FET stage 113 and also connected to the drain of the shunt FET stage 113 through the short circuit resistor 125.

DC cut capacitors 941, 942, 945, 946, 949, and 950 are respectively provided at the drain sides and source sides of the path switching FET stages 108 to 110. DC cut capacitors 943, 944, 947, 948, 951, and 952 are respectively provided at the drain sides and source sides of the shunt FET stages 111 to 113. Each of the DC cut capacitors 941 to 952 interrupts the direct current and allows the high-frequency signal to pass therethrough in order to maintain a potential applied to the drain or source of each of the path switching PET stages 108 to 110 and the shunt FET stages 111 to 113.

Operation Example of High-Frequency Semiconductor Switching Circuit

A case where one or more out of three paths are caused to become the conducting state will be explained as Operation Example of the high-frequency semiconductor switching circuit of FIG. 11.

As with Embodiment 1 of the present invention, the diode-switch logic circuit 100 operates in accordance with the truth table of FIG. 2. For example, when the gate voltage of an arbitrary path switching FET stage (108 to 110) is the high level, the corresponding PMOSFET (332 to 337) is turned off. Therefore, the voltage of the low level (0 V) is applied to each of the source and drain of the arbitrary path switching FET stage (108 to 110). With this, the path switching FET stage (108 to 110) can surely operate by a forward bias of 0 V or more.

In contrast, when the gate voltage of an arbitrary path switching FET stage (108 to 110) is the low level (0 V), the corresponding PMOSFET (332 to 337) is turned on. Therefore, the source voltage and drain voltage of the arbitrary path switching FET stage (108 to 110) become the high level. With this, each of the source voltage and drain voltage of the arbitrary path switching FET stage (108 to 110) is fixed to a voltage which has dropped from the control voltage of the corresponding control terminal by the forward voltage of the PN junction diode (126 to 131) corresponding to the arbitrary path switching PET stage (108 to 110). Thus, the reverse bias is applied to the arbitrary path switching FET stage (108 to 110), so that the arbitrary path switching FET stage (108 to 110) can be caused to surely become the cutoff state.

As above, the present embodiment can provide the high-frequency semiconductor switching circuit having the effects of Embodiment 1, capable of causing three or more path switching FET stages (108 to 110) to surely become the conducting state or the cutoff state and suppressing the leakage to the high-frequency signal path of the cutoff state, and including satisfactory properties, such as the high isolation and the low strain. Further, without adding a dedicated power supply terminal, the source voltages and drain voltages of three or more path switching FET stages (108 to 110) can be fixed. Therefore, the high-frequency semiconductor switching circuit can be reduced in size, and therefore, the mobile communication device including the high-frequency semiconductor switching circuit can be reduced in size, and the power consumption can be reduced.

Modification Example

Basically, the same modification example as Embodiment 1 is applicable to the present embodiment.

For example, the diode-switch logic circuit 100 may be configured as a separate circuit as long as the separate circuit can perform the same operations as the configuration of FIG. 11. In addition, the PMOSFETs 332 to 337 may be inversion control switches, and the PN junction diodes 126 to 131 may be diode-connected NMOSFETs.

In the present embodiment, the SP3T switch including one input and three outputs has been explained as one example of the high-frequency switching circuit. However, the present embodiment is applicable to a wide range of multi-input multi-output high-frequency switching circuits, such as the SP4T switch.

In the present embodiment, the shunt FET stages for securing the isolation are respectively connected to the high-frequency signal paths. However, the present embodiment is applicable to a case where one shunt FET stage is only connected to one specific high-frequency signal path.

The present embodiment is applicable to a case where the number of FETs provided on each high-frequency signal path is two or more.

Embodiment 3

Mobile Communication Device

Figure 12:
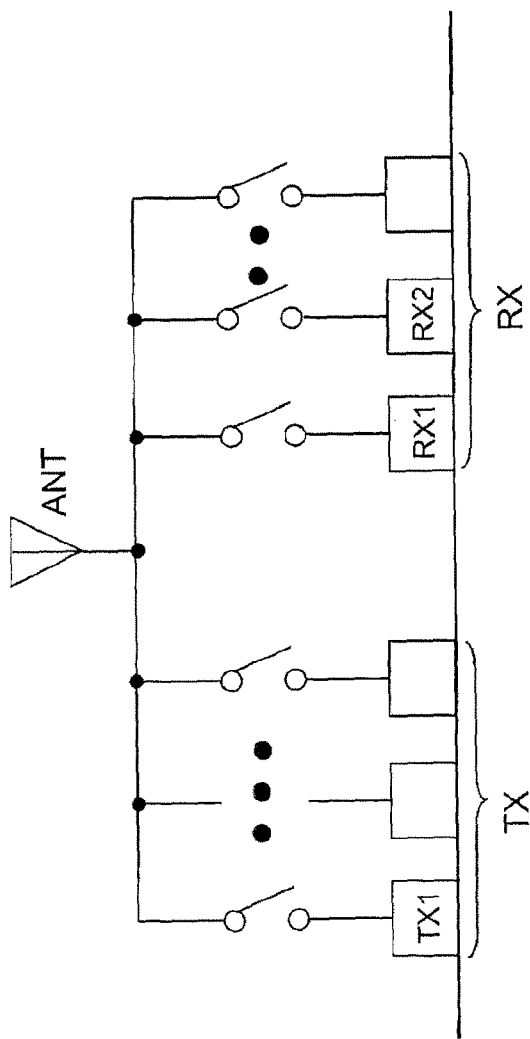
FIG. 12 is a schematic diagram showing a configuration example of a mobile communication device including the high-frequency semiconductor switching circuit according to Embodiment 3 of the present invention.

FIG. 12 is a schematic diagram showing a configuration example of a mobile communication device including the high-frequency semiconductor switching circuit according to Embodiment 3 of the present invention. The mobile communication device shown in FIG. 12 is a device configured to switch the transmission and reception with respect to an antenna ANT and handle two or more types of electric power, such as high electric power and low electric power, which are different in magnitude. In addition, the mobile communication device shown in FIG. 12 uses a quasi-microwave hand as a communication band.

The mobile communication device shown in FIG. 12 includes the high-frequency semiconductor switching circuit configured to perform switching of at least three high-frequency signals with respect to the antenna ANT. Specifically, one high-frequency signal is transmitted from a transmitting circuit TX1, and two high-frequency signals are respectively received by receiving circuits RX1 and RX2. In a case where the MOSFET constituting the high-frequency signal path handles high electric power, strain tends to occur in the MOSFET of the cutoff state. Therefore, by connecting a plurality of MOSFETs in series, the high-frequency signal of high electric power can be handled.

According to the present embodiment, as shown in FIG. 12, in a case where the type of electric power to be handled is different among a plurality of high-frequency signal paths, and there are a plurality of high-frequency signal paths on the reception side, a part of the MOSFETs of the path switching FET stages provided on the plurality of high-frequency signal paths on the reception side are integrated. With this, an antenna switching circuit having the same level of strain property as a conventional antenna switching circuit can be further reduced in size.

Configuration of High-Frequency Semiconductor Switching Circuit

Figure 13:
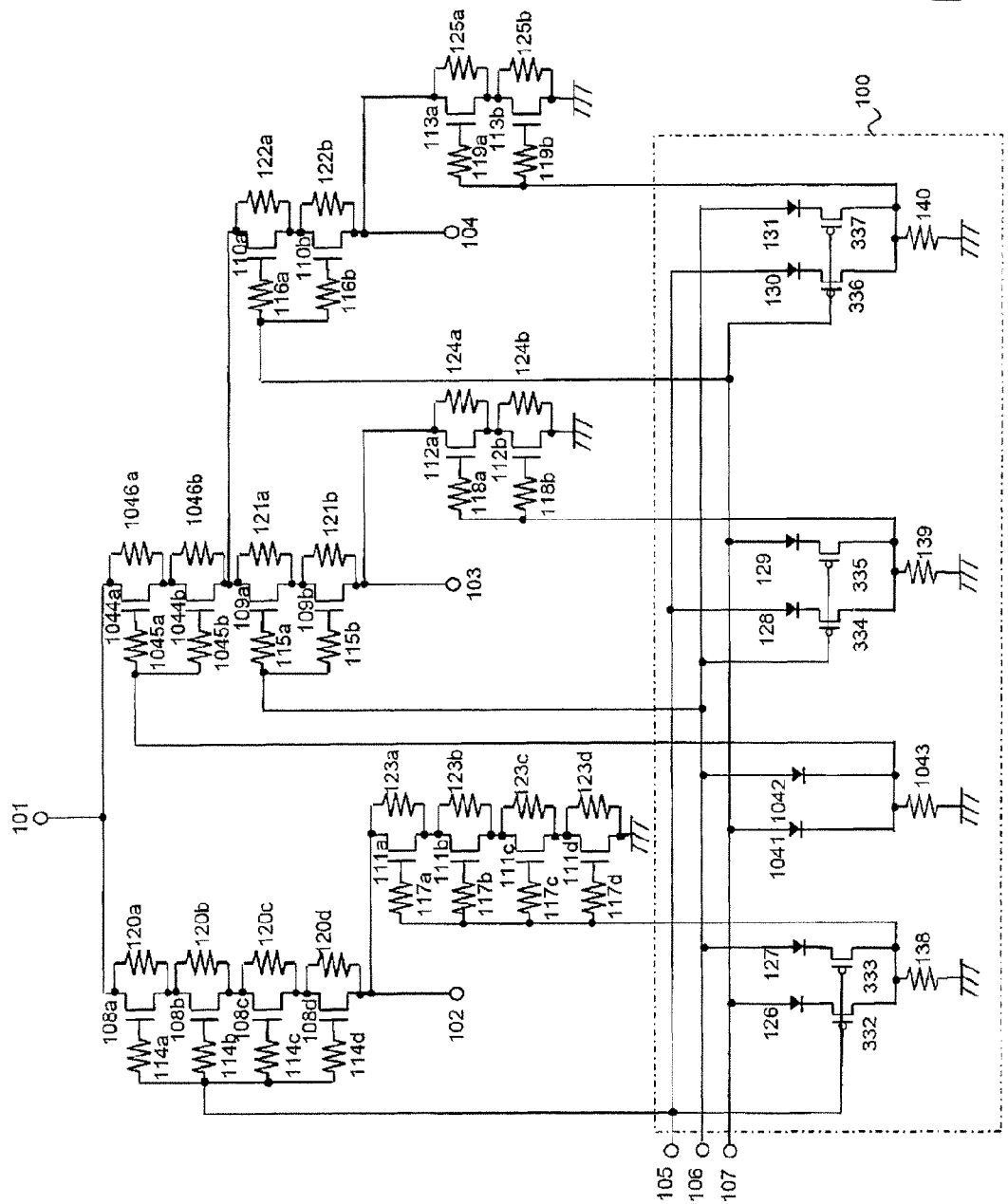
FIG. 13 is a circuit diagram showing a configuration example of the high-frequency semiconductor switching circuit according to Embodiment 3 of the present invention.

FIG. 13 is a circuit diagram showing a configuration example of the high-frequency semiconductor switching circuit according to Embodiment 3 of the present invention. For example, the following assumes a case where in the high-frequency SP3T switch, the common input-output terminal 101 is used as the antenna ANT of FIG. 12, the individual input-output terminal 102 is used as a terminal of the transmitting circuit TX1 side of FIG. 12, the individual input-output terminal 103 is used as a terminal of the receiving circuit RX1 side of FIG. 12, and the individual input-output terminal 104 is used as a terminal of the receiving circuit RX2 side of FIG. 12.

The high-frequency semiconductor switching circuit of FIG. 13 includes the common input-output terminal 101, the individual input-output terminals 102 to 104, the control terminals 105 to 107, the PN junction diodes 126 to 131, the PMOSFETs 332 to 337, and the ground resistors 138 to 140. These components are the same as those of the high-frequency semiconductor switching circuit of FIG. 5.

In order to increase the withstand voltage in the case of handling the high-frequency signal of high electric power, the path switching FET stage 108 is configured by connecting, for example, four path switching FETs 108a to 108d in series, gate resistors 114a to 114d are respectively connected to gates of the path switching FETs 108a to 108d, and short circuit resistors 120a to 120d are respectively connected between sources and drains of the path switching FETs 108a to 108d. Similarly, in order to increase the withstand voltage in the case of handling the high-frequency signal of high electric power, the shunt FET stage 111 is configured by connecting, for example, four shunt FETs 111a to 111d in series, gate resistors 117a to 117d are respectively connected to gates of the shunt FETs 111a to 111d, and short circuit resistors 123a to 123d are respectively connected between sources and drains of the shunt FETs 111a to 111d.

Similarly, in order to increase the withstand voltage in the case of handling the high-frequency signal of high electric power, the path switching FET stage 109 is configured by connecting, for example, two MOSFETs 109a and 109b in series, and the path switching FET stage 110 is configured by connecting, for example, two MOSFETs 110a and 110b in series. The drain sides of the path switching FET stages 109 and 110 are short-circuited, and its short-circuit point is connected through a common path switching FET stage 1044 to the common input-output terminal 101. Gates of the MOSFETs 109a and 109b are respectively connected to gate resistors 115a and 115b, a short circuit resistor 121a is connected between a source and drain of the MOSFET 109a, and a short circuit resistor 121b is connected between a source and drain of the MOSFET 109b. Gates of the MOSFETs 110a and 110b are respectively connected to gate resistors 116a and 116b, a short circuit resistor 122a is connected between a source and drain of the MOSFET 110a, and a short circuit resistor 122b is connected between a source and drain of the MOSFET 110b.

Similarly, in order to increase the withstand voltage in the case of handling the high-frequency signal of high electric power, the shunt FET stage 112 is configured by connecting, for example, two shunt FETs 112a and 112b in series, and the shunt FET stage 113 is configured by connecting, for example, two shunt FETs 113a and 113b. The drains of the shunt FET stages 112 and 113 are respectively connected to the individual input-output terminals 103 and 104. Gates of the shunt FETs 112a and 112b are respectively connected to the gate resistors 118a and 118b, and a short circuit resistor 124a is connected between a source and drain of the shunt FET stage 112a, and a short circuit resistor 124b is connected between a source and drain of the shunt FET stage 112b. Gates of the shunt FETs 113a and 113b are respectively connected to gate resistors 119a and 119b, and a short circuit resistor 125a is connected between a source and drain of the shunt FET stage 113a, and a short circuit resistor 125b is connected between a source and drain of the shunt FET stage 113b.

Gates of two common path switching FETs 1044a and 1044b constituting the common path switching FET stage 1044 are respectively connected to gate resistors 1045a and 1045b, a gate resistor 1046a is connected between a source and drain of the common path switching FET 1044a, and a gate resistor 1046b is connected between a source and drain of the common path switching FET 1044b. An anode side of a diode 1041 is connected to the control terminal 107, and an anode side of a diode 1042 is connected to the control terminal 106. Cathode sides of the diodes 1041 and 1042 are short-circuited, and its short-circuit point is connected through the gate resistors 1045a and 1045b to the gates of the common path switching FETs 1044a and 1044b and connected through a ground resistor 1043 to the ground.

Operations of High-Frequency Semiconductor Switching Circuit

Since the diode-switch logic circuit 100 performs the same operations as the circuit of FIG. 5, the path switching FET stages 108 to 110 and the shunt FET stages 111 to 113 operate in accordance with the truth table of FIG. 2.

Moreover, a voltage which has dropped from a voltage, determined by the logical sum of a voltage applied to the control terminal 106 and a voltage applied to the control terminal 107, by the forward voltage of one diode is applied to each of the gates of the common path switching FETs 1044a and 1044b constituting the common path switching FET stage 1044. Therefore, only when the path switching FET stage 109 or the path switching FET stage 110 is the conducting state, the common path switching FET stage 1044 becomes the conducting state.

As above, by integrating two high-frequency signal paths of a receiving portion RX into one path, parasitic capacitance when the high-frequency signal path of a transmitting portion TX is caused to become the conducting state can be reduced, which is effective for the improvement of the strain property. In addition, integrating two high-frequency signal paths into one path is effective for the size reduction.

In the above circuit configuration, two or more high-frequency signal paths, such as the paths of the receiving circuit RX1 and the receiving circuit RX2 or the paths of the receiving circuit RX1 and the transmitting circuit TX1, may become the conducting state.

As above, according to the present embodiment, for example, in a case where the type of electric power to be handled is different among the high-frequency signal paths, such as a case where the transmission and reception with respect to the mobile communication device are switched, a part of MOSFETs constituting two or more reception-side path switching FET stages configured to handle the high-frequency signal of low electric power can be integrated, and the integrated MOSFET can be controlled by the diode-switch logic circuit 100. As a result, since it is unnecessary to increase the circuit configuration of a control system, a high-function high-frequency switching circuit capable of causing two or more path switching FET stages to become the conducting state at the same time can be realized while maintaining satisfactory properties, such as the low insertion loss, the high isolation, and the low strain, and realizing the size reduction and the low power consumption without adding a power supply terminal.

Modification Example

Basically, the same modification example as Embodiment 1 is applicable to the present embodiment.

For example, the diode-switch logic circuit 100 may be configured as a separate circuit as long as the separate circuit can perform the same operations as the configuration of FIG. 13. In addition, the PMOSFETs 332 to 337 may be inversion control switches, and the diodes 126 to 131, 1041, and 1042 may be diode-connected NMOSFETs.

In the present embodiment, the SP3T switch including one input and three outputs has been explained as one example of the high-frequency semiconductor switching circuit. However, the present embodiment is applicable to a wide range of multi-input multi-output high-frequency semiconductor switching circuits, such as the SP4T switch.

In the present embodiment, the shunt FETs for securing the isolation are respectively connected to the high-frequency signal paths. However, the present embodiment is applicable to a case where one shunt FET is only connected to one specific high-frequency signal path.

In the present embodiment, at the transmitting portion TX side, each of the path switching FET stage and the shunt FET stage is constituted by four FETs, and at the receiving portion RX side, the common path switching FET stage is constituted by two FETs, and each of the path switching FET stages and the shunt FET stages is constituted by two FETs. However, the present embodiment is not limited to this.

In the present embodiment, in the SP3T switch, a part of two high-frequency signal paths at the receiving portion RX side are formed as the common path switching FET stage 1044. However, the number of high-frequency signal paths to be integrated is not limited to this. In the multi-input multi-output high-frequency semiconductor switching circuit, such as the SP4T switch, MOSFETs formed as a part of three or more high-frequency signal paths may be integrated.

The number of short circuit resistors connected between the source and drain of each FET may be one or may be zero.

From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the spirit of the present invention.

The high-frequency semiconductor switching circuit of the present invention is useful for mobile communication devices, such as mobile phones, which are required to be small in size, light in weight, and low in power consumption.

What is claimed is:

1. A high-frequency semiconductor switching circuit comprising:
   a semiconductor substrate;
   one common input-output terminal, three or more individual input-output terminals, and three or more control terminals corresponding to the three or more individual input-output terminals, these terminals being formed on the semiconductor substrate;
   three or more path switching FET stages formed on the semiconductor substrate and each provided between the common input-output terminal and a corresponding one of the three or more individual input-output terminals;
   one or more shunt FET stages formed on the semiconductor substrate and each provided between ground and at least one of the three or more individual input-output terminals; and
   a diode-switch logic circuit including diodes and switches formed on the semiconductor substrate such that a group of a part of the diodes and a part of the switches corresponds to each of the one or more shunt FET stages, the diode-switch logic circuit being configured to control the three or more path switching FET stages and the one or more shunt FET stages, wherein:
   the diode-switch logic circuit is configured to respectively apply control voltages, respectively input to the three or more control terminals, to gates of the three or more path switching FET stages in order that at least one of high-frequency signal paths between the common input-output terminal and the respective individual input-output terminals is caused to become a conducting state, and the other high-frequency signal paths are caused to become a cutoff state;
   the diode-switch logic circuit is configured to respectively apply logic synthesis voltages to gates of the one or more shunt FET stages, each of the logic synthesis voltages being obtained by logic synthesis of the control voltages respectively input to the three or more control terminals; and
   the diode-switch logic circuit is configured such that in a case where the one or more shunt FET stages are three or more shunt FET stages corresponding to the three or more path switching FET stages, the logic synthesis voltage corresponding to one of the three or more shunt FET stages is generated as a logical product of a logical negation of the control voltage applied to the one of the three or more shunt FET stages and a logical sum of the control voltages respectively applied to the remaining shunt FET stages other than the one of the three or more shunt FET stages.

2. The high-frequency semiconductor switching circuit according to claim 1, wherein:
   in a case where the one or more shunt FET stages are the three or more shunt FET stages corresponding to the three or more path switching FET stages,
   the diodes and the switches corresponding to the one of the three or more shunt FET stages are respectively connected in series to the remaining control terminals other than the control terminal to which the control voltage to be applied to the gate of one of the three or more path switching FET stages corresponding to the one of the three or more shunt FET stages is input,
   each of the switches is an inversion control switch configured to be turned off when the control voltage to be applied to the gate is a high level and turned on when the control voltage to be applied to the gate is a low level, cathode sides of the diodes respectively connected to the remaining control terminals are short-circuited, a ground resistor is connected between ground and a short-circuit point where the cathode sides of the diodes respectively connected to the remaining control terminals are short-circuited, and a voltage of the short-circuit point is the logic synthesis voltage to be applied to the gate of the one of the three or more shunt FET stages.

3. The high-frequency semiconductor switching circuit according to claim 2, further comprising:

first short circuit resistors each connected between a source and drain of a corresponding one of the three or more path switching FET stages;

second short circuit resistors each connected between a source and drain of a corresponding one of the one or more shunt FET stages;

first DC cut capacitors respectively provided at drain sides and source sides of the three or more path switching FET stages; and second DC cut capacitors respectively provided at drain sides and source sides of the one or more shunt FET stages, wherein:

the short-circuit points at each of which the cathode sides of the diodes are short-circuited are each connected through a corresponding one of the first short circuit resistors to the drain side of a corresponding one of the three or more path switching FET stages; and the three or more control terminals are each connected through a corresponding one of the second short circuit resistors to the drain side of a corresponding one of the one or more shunt FET stages.

4. The high-frequency semiconductor switching circuit according to claim 2, wherein:

each of the three or more path switching FET stages is configured by connecting a plurality of path switching FETs in series;

each of the one or more shunt FET stages is configured by connecting a plurality of shunt FETs in series; and a part of the path switching FETs constituting at least two out of the three or more path switching FET stages are integrated.

5. The high-frequency semiconductor switching circuit according to claim 1, wherein the semiconductor substrate is a SOI substrate or a SOS substrate.

6. The high-frequency semiconductor switching circuit according to claim 5, wherein:

the diodes are PN junction diodes formed on the semiconductor substrate;

anode sides of the diodes are respectively connected to the control terminals; and cathode sides of the diodes are respectively connected to the switches.

7. The high-frequency semiconductor switching circuit according to claim 5, wherein:

the diodes are diode-connected NMOSFETs;

drains of the diodes are respectively connected to the control terminals;

sources of the diodes are respectively connected to the switches; and gates of the diodes are respectively connected to the drains of the diodes.

8. The high-frequency semiconductor switching circuit according to claim 5, wherein:

the switches are PMOSFETs;

sources of the switches are respectively connected to cathode sides of the diodes;

drains of the switches are respectively connected to the short circuit resistors; and gates of the switches are respectively connected to the control terminals.

9. The high-frequency semiconductor switching circuit according to claim 5, wherein each of the three or more path switching FET stages is configured by connecting a plurality of MOSFETs in series.

10. The high-frequency semiconductor switching circuit according to claim 5, wherein each of the one or more shunt FET stages is configured by connecting a plurality of MOSFETs in series.

* * * * *